US007718961B1

(12) United States Patent
Browning

(10) Patent No.: US 7,718,961 B1
(45) Date of Patent: May 18, 2010

(54) PHOTOELECTRON MICROSCOPE

(76) Inventor: Raymond Browning, 522 Chestnut St. #1, San Carlos, CA (US) 94070

( * ) Notice: Subject to any disclaimer, the term of this patent is extended or adjusted under 35 U.S.C. 154(b) by 657 days.

(21) Appl. No.: 11/623,280

(22) Filed: Jan. 15, 2007

(51) Int. Cl.
*H01J 29/84* (2006.01)
*H01J 37/26* (2006.01)
(52) U.S. Cl. .................. 250/306; 250/305; 250/396 ML
(58) Field of Classification Search .................. 250/305, 250/306, 307, 310, 396 R, 396 ML, 398
See application file for complete search history.

(56) References Cited

U.S. PATENT DOCUMENTS

| 4,486,659 A | 12/1984 | Turner |
| 4,554,457 A | 11/1985 | Kelly |
| 4,758,723 A | 7/1988 | Wardell et al. |
| 4,810,879 A | 3/1989 | Walker |
| 5,045,696 A | 9/1991 | Hirose |
| 5,166,519 A | 11/1992 | Turner |
| 5,285,066 A | 2/1994 | Sekine et al. |
| 5,569,916 A | 10/1996 | Tomie |
| 6,326,617 B1 | 12/2001 | Tomie et al. |
| 7,608,838 B1 * | 10/2009 | Browning ............ 250/396 ML |

FOREIGN PATENT DOCUMENTS

GB 2137802 A * 10/1984

OTHER PUBLICATIONS

Beamson et. al., 'Photoelectron spectromicroscopy' Nature vol. 290, p. 556, 1981.
Kim et. al. Review of Scientific Instruments, 'Construction of a new imaging bandpass analyzer for a magnetic projection photoelectron microscope' vol. 66(5) p. 3159, 1995.
Pianetta et al., 'Core level photoelctron microscopy with synchrotron radiation' Review of Scientific Instruments, vol. 60 (7) p. 1686. 1989.

* cited by examiner

*Primary Examiner*—Jack I Berman

(57) ABSTRACT

A photoelectron microscope with a magnetic projections lens incorporating a cyclotron orbit radius filter. The microscope can be used with a monochromatic source of photons to image surface potential and Fermi level shifts with sub micron spatial resolution.

5 Claims, 24 Drawing Sheets

PHOTOELECTRON MICROSCOPE

TECHNICAL FIELD

The present invention relates generally to electron optics, and more particularly to electron microscopes, and more particularly to a photoelectron microscope, and more particularly to a photoelectron microscope with a magnetic projection lens, and more particularly to a magnetic projection lens having a cyclotron orbit radii filter, and more particularly to a cyclotron orbit radii filter being composed of a grid having apertures defining the spatial resolution of the projection lens. In another aspect of the invention the magnetic projection lens has a magnetic field which is terminated by a magnetic plate with an aperture. In another aspect of the invention the electrons exiting the magnetic projection lens through the aperture are focused into an energy analyzer using an electron optical lens, and more particularly an energy band pass analyzer, and more particularly a concentric hemispherical analyzer, and more particularly a magnetic electron optical lens. The electrons focused into the energy analyzer are energy resolved and exit the energy analyzer. The energy resolved electrons exiting the analyzer are then imaged using a second electron optical lens as an energy resolved image onto an electron sensitive detector. In another aspect of the invention the projection lens is a permanent magnet assembly and more particularly a permanent magnet assembly that maximizes the projected field using blocking magnets.

BACKGROUND INFORMATION AND DISCUSSION OF RELATED ART

Photoelectron microscopes are used for understanding the surface state of material systems. A photoelectron microscope uses photons to excite the emission of electrons from the surface of a material into a vacuum where spatial variations in the electron flux is used to image the surface. The information that can be extracted from an image includes variations in the chemistry, the crystal structure, the position of the Fermi level, and the surface potential. The kinetic energy of the emitted electron, $E_{kinetic}$, is related to the energy of the photon, $E_{photon}$, by the relationship:

$$E_{binding} = E_{photon} - E_{kinetic} - \Phi$$

Where $E_{binding}$ is the binding energy of the electron in the material and $\Phi$ is the work function. If the photon has sufficient energy it can cause electron emission into the vacuum from either a localized atomic level, a valency band, or a conduction level state in the material. Depending on the energy of the incident photon which can excite a range of different electronic transitions in the atoms and valency bands of the material the resultant kinetic energy of the electron can provide detailed information about the atomic species and the chemical state of the material surface. When X-ray energies are used for excitation of core level electrons the techniques is known as X-ray photoelectron spectroscopy. The emitted energies in XPS are typically below 1.5 keV. Because of the chemical species and chemical state specificity the technique is also known as electron spectroscopy for chemical analysis or ESCA. The electrons leave the surface with a range of energies depending on their individual history and losses in the surface of the solid. The energy of the photoelectrons leaving the sample is determined using an electron energy analyzer, usually a high resolution concentric hemispherical analyzer (CHA). Sweeping the analyzer with energy gives a spectrum with a series of photoelectron peaks. Because the range of electrons with energies below 1.5 keV in a material is very small the spectrum represents the chemistry of the top few atomic layers of a material. Contrast in the spatial emission of electrons from different areas of the material are thus due to differences in elemental species and their chemical states across the surface. The contrast is present as both total intensity of the emitted electrons and as structure in the electron energy distribution. This structure can be imaged by either changing the photon energy to excite a particular core level or by analyzing the kinetic energy of the emitted electrons and imaging only those electrons in a range of interest.

In an XPS-microscope an electron energy analyzer is used. Ideally, the energy analyzer must preserve the image with a minimum of distortion and loss of spatial resolution. There have been two types of analyzer used for this task, a high pass analyzer and a band pass analyzer. The band pass analyzer is typically a retarding grid arrangement which rejects electrons energies below the grid retarding potential. The image is formed by differentiating the electron signal intensity as the energy is swept through a feature of interest in the spectrum. Although this is a straightforward technique the problem is that it is intrinsically noisy and of low energy resolution. Consequently, there has been a trend to using a band pass analyzer such as a CHA which separates out and images only those electrons in the range of interest. However, there is a problem with this approach. It is difficult to transfer the electrons from the imaging lens system into the energy analysis system and preserve the image. The reason for this problem is the type of imaging lens that is used in XPS-microscopy is typically a magnetic immersion lens. An immersion lens is used to collect as much of the available emitted electrons as is then possible to reduce the time required to collect images. One of the most successful approaches to this is a development of the work of Beamson et. al., Nature Vol. 290, p. 556, 1981 and Turner U.S. Pat. No. 4,486,659. Beamson et. al. and Turner teach that an axially symmetric divergent magnetic field can generate an enlarged image of a photo-emissive surface while preserving the original energy distribution. They further teach that an energy resolved image can be made by inserting a retarding field electron energy analyzer into the diverging magnetic field. This work was later developed by several authors with several variations in instrument design. Kim et. al. Review of Scientific Instruments, vol. 66(5) p. 3159, 1995 teach that the field of a magnetic projection microscope can be terminated by a stack of magnetic grids in front of the entrance aperture of a band pass spectrometer. However, it is not clear that the terminating field has an influence on the spatial resolution which was measured at 3.5 micron for 4 eV photoelectrons. Hirose U.S. Pat. No. 5,045,696 teaches that by reducing the energy of the collected photoelectrons to those emitted with energies below 1 eV the spatial resolution can be improved in a photoelectron microscope using a projection lens. Hirose used a pulsed X-ray source and a pulsed electronic gating method to only image slower electrons but this necessarily means the high energy electrons that have chemical specificity cannot be imaged. Sekine et. al. U.S. Pat. No. 5,285,066 have an alternative imaging lens that does not require a strong magnetic field at the sample and thus they can image more easily into a band pass analyzer. They use a concentric hemispherical analyzer CHA with a long entrance slit. A line of the image is thus imaged and energy resolved and the sample areas is swept electronically to produce a two dimensional energy resolved image. Walker U.S. Pat. No. 4,810,879 teaches that a magnetic immersion lens can be used to focus photoelectrons into a spectrometer. The immersion lens of Walker has a limited magnetic field extent and is used for focusing into subsequent electron lenses and is not used for projection of the electrons.

The variations of XPS microscopes are described above are included in a variety of commercially available systems. However, none of these systems has a spatial resolution significantly below 5 microns. Further, the data from the instruments is either an image at a particular energy or a energy spectrum, not both. Further, for electrons above a few electron volts the spatial resolution is much greater than 5 microns.

The high energy photoelectrons containing much of the chemically specific information that includes both elemental and chemical state are difficult to image at a high spatial resolution.

When UV photons are used the spatial resolution of the microscope is much improved as the photoelectrons are now emitted with a lower energy and the cyclotron radius is smaller. However, even at the strongest continuous magnetic fields available, 10-20 T (Tesla), the spatial resolution of the Fermi level is still only in the 1-2 micron region.

Much of the phenomena associated with materials science and electronics is at a much smaller scale than currently obtainable with X-ray microscopes with much interest in the 100 nm range and below.

What is desired, therefore, is a photoelectron microscope that is suitable for imaging surfaces with high spatial and energy resolution. The information contained in the images includes chemical species, chemical state, Fermi level, and surface potential.

SUMMARY OF THE INVENTION

It is an object of the invention to provide a photoelectron microscope that can be used with a monochromatic source of photons to image surface potential and Fermi level shifts with sub micron spatial resolution.

Accordingly the invention is characterized by a photoelectron microscope with a magnetic projections lens incorporating a cyclotron orbit radius filter.

The invention is further characterized by an electron microscope apparatus comprising: a) a source of photons of sufficient energy to excite electrons from a material sample; b) a magnetic projection lens having an electron optical path; c) a sample holding device within said magnetic projection lens; d) a conducting plate with a plurality of apertures, said apertures having approximately similar predetermined dimensions and said apertures sited in said electron optical path; e) a first means to change the apparent electron optical position of said apertures within said electron optical path; f) a second means to change the electrical potential of said conducting plate; g) an electron sensitive imaging detector; whereby photoelectrons excited from near the Fermi level of a sample are imaged with enhanced spatial resolution by said electron sensitive imaging detector.

The present invention satisfies the need for photoelectron microscope that can be used to image surface potential and Fermi level shifts with sub micron spatial resolution.

These and other aspects and benefits of the invention will become more apparent upon analysis of the drawings, specification and claims.

BRIEF DESCRIPTION OF THE SEVERAL VIEWS OF THE DRAWINGS

The invention will be better understood and the objects and advantages of the present invention will become apparent when consideration is given to the following detailed description thereof. Such description makes reference to the annexed drawings wherein.

DETAILED DESCRIPTION OF THE INVENTION

Figure 1:
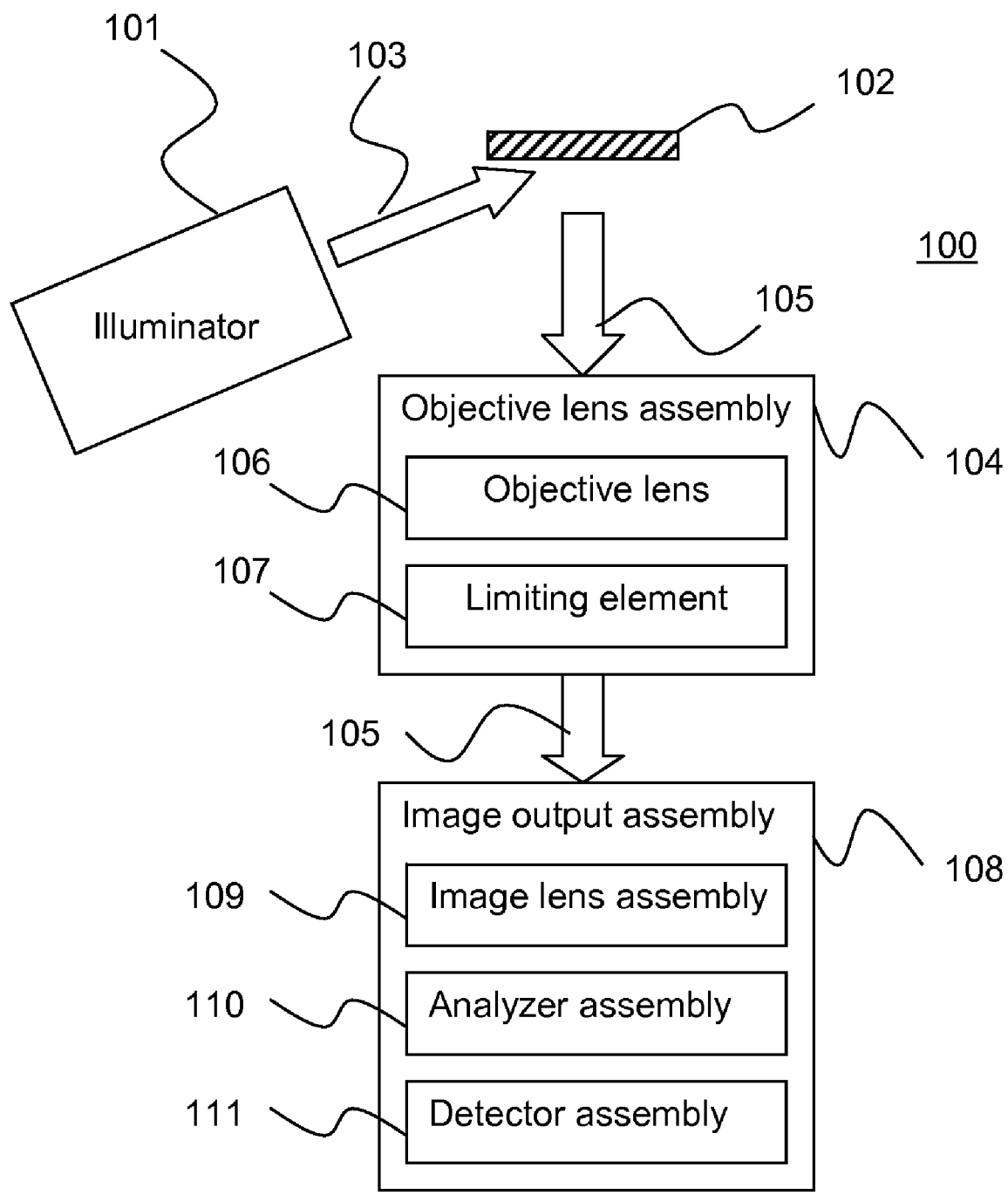
FIG. 1 is a block diagram illustrating the parts of an electron microscope.

Referring to FIGS. 1 through 23, wherein like reference numerals refer to like components in the various views, there is illustrated therein a new and improved electron optical apparatus.

It is an object of the invention to provide a projection electron lens apparatus with a high spatial resolution. It is a further object of the invention to provide a high spatial resolution photoelectron microscope apparatus. It is a further object of the invention to provide a high spatial resolution photoelectron microscope apparatus with energy resolved imaging. It is a further object of the invention to provide an electron optical device that limits the cyclotron orbit radii within a magnetic field. It is a further object of the invention to provide a projection magnetic field using a permanent magnet device.

The invention described herein is contained in several functional elements and sub-elements individually and combined together to form the elements of an electron microscope of a novel class. FIG. 1 illustrates the hierarchy, linkages, and general functionality of the elements of the electron microscope 100. The first element is an illuminator 101. The illuminator 101 illuminates the sample 102 to be imaged with the probe radiation 103. The probe radiation 103 in general can be photons, electrons, ions, or other types of radiation. The illuminator 101 is the source of the probe radiation 103 and may collimate, focus, vignette, or otherwise manipulate the probe radiation 103 and how it irradiates the sample 102. The objective lens assembly 104 is defined as that element that directly images the sample 102, or object, either by using the probe radiation 103 after interaction with the sample 102, or by using secondary radiation from the interaction of the primary probe radiation 103 and the sample 102. The radiation imaged by the objective lens assembly 104 is the imaging radiation 105. The objective lens assembly 104 typically determines image qualities such as intensity and spatial resolution by limiting the acceptance angle or other property of the objective lens assembly 104. The objective lens assembly 104 is correspondingly illustrated as being composed of two sub-elements. The first sub-element of the objective lens assembly 104 is the objective lens 106 that collects the imaging radiation 105 and provides a real or virtual image for subsequent microscope elements. The second sub-element of the objective lens assembly 104 is the limiting element 107. The image output assembly 108 has the role of reducing the imaging radiation 105 provided by the objective lens assembly 104 to a useful form. This useful form may be a magnified real image projected onto a detector such as a photographic plate, an energy resolved signal projected onto a detector, or in a form resolving any other property contained in the imaging radiation. The image output assembly 108 correspondingly is illustrated as having three sub-elements. The first sub-element is the image lens assembly 109. The second sub-element is the analyzer assembly 110. The third sub-element is the detector assembly 111. The invention described herein resides in novel aspects of the objective lens 106, the limiting element 107, the image lens assembly 109, the analyzer assembly 110, and the detector assembly 111, both individually and in combination with other elements of the microscope 100.

Figure 2:
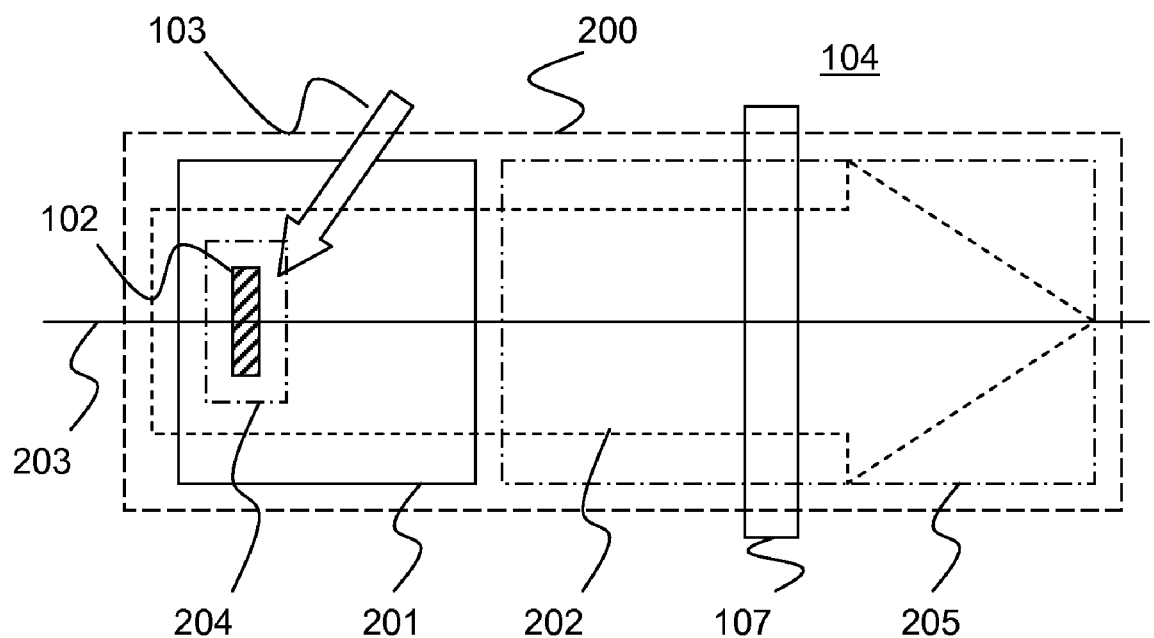
FIG. 2 is a schematic illustrating the parts of an objective lens assembly.

The first preferred embodiment of the invention is shown in FIG. 2 which shows the main parts of the objective lens assembly 104. The objective lens 106 in the preferred implementation is a projection lens 200. The projection lens 200 includes: a magnetic field generator 201 that generates an axial magnetic field 202 along the axis 203 of the projection lens 200, a sample volume 204 within the magnetic field 202 where the probe radiation 103 irradiates the sample 102, and a projection path region 205 in front of the sample where the magnetic field extends. The limiting element 107 is situated along the projection path region 205.

The probe radiation 103 irradiates the sample 102 which is sitting in the sample volume 204 within the axial magnetic field 202. Radiation in the form of charged particles and more particularly electrons that are emitted from the sample 103 surface are projected along the axial magnetic field 202 as a real projected image of the variations in surface emissivity across the sample 102. If the axial magnetic field 202 is steadily decreasing with distance along the axis 203 away from the sample volume 204 then there is a magnification of the projected image. This magnification is due to the fact that the charged particles in a magnetic field are constrained to follow magnetic field lines. Thus, as the axial magnetic field 202 decreases the field lines diverge and a magnification of the relative positions of the charged particles occurs.

Figure 3:
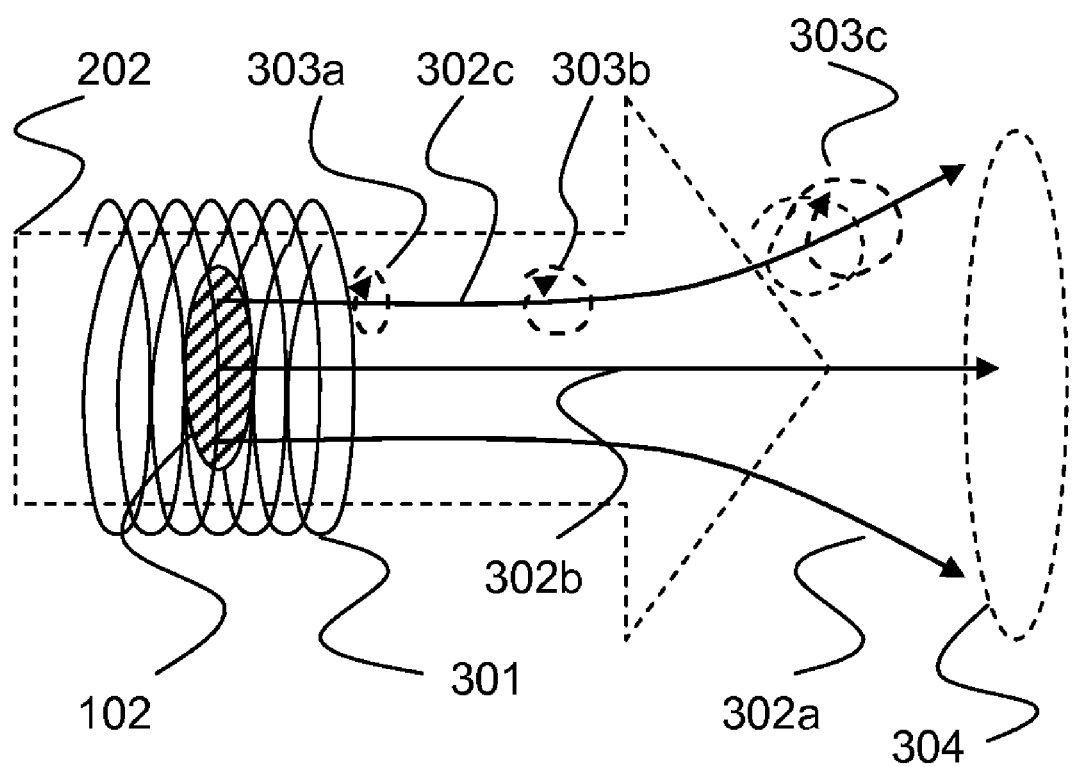
FIG. 3 illustrates the action of a magnetic projection lens.

The action of the projection lens 200 is illustrated in FIG. 3. A sample 102 resides in an axial magnetic field 202 created by a current carrying solenoid 301. The axial magnetic field 202 from the current carrying solenoid 301 decreases with distance along the axis of the current carrying solenoid 301 and the magnetic field lines 302a,b,c diverge. Electrons emitted from the surface of the sample 102 are constrained to move along the magnetic field lines 303a,b,c in cyclotron orbits 303a,b,c which are helices along the field lines 303a,b,c. The divergence of the magnetic field lines 302a,b,c causes a magnification of the image formed by the photoelectrons of the surface of the sample 102. This magnified image can be projected onto an image plane 304. The cyclotron orbits 303a,b,c also grow larger in radius as the magnetic field decreases and the helical orbits stretch out in the direction of motion. Consequently, at the lower magnetic field at the image plane 304 the photoelectrons are moving with most of their energy in the forward direction along the field lines 303a,b,c.

As will be explained below the spatial resolution of the image depends on the radii of the cyclotron orbits 303a,b,c at the surface of the sample 102.

The magnification, M, of the projection lens depends on the value of the axial magnetic field 202, $B_{sample}$, at the surface of the sample 102 compared to the value of the axial magnetic field 202, $B_{image}$, at the image plane 304 with the following relationship:

$$M = \left(\frac{B_{sample}}{B_{image}}\right)^{\frac{1}{2}}$$

The radii of the cyclotron orbits 303a,b,c change with the magnetic field in the same relationship. Thus, the relative size of the cyclotron orbits 303a,b,c and the image size stay the same and the image resolution stays the same. The cyclotron obit radius is determined by the value of the axial magnetic field and the off axis, or radial, component of the electron energy.

The original paper describing the projection lens was by Beamson et al. Their estimate for the spatial resolution at any emitted electron energy was Rmax/10. Where Rmax is the cyclotron orbit radius of the electron with the maximum off axis energy. Pianetta et al. Review Scientific Instruments, vol 60(7), p. 1686, 1989 suggested that this was too low but gave no definite estimate. Experiments suggest that Pianetta et al. were more realistic.

The spatial resolution is limited by the cyclotron radius of the electrons emitted from the surface. The radius, R of the electron of total energy E emitted at an angle θ to the magnetic field direction is:

$$R = \frac{(2mE)^{\frac{1}{2}}\sin(\theta)}{eB}$$

Where B is the magnetic field strength, m is the mass of the electron, and e is the charge of the electron.

Figure 4:
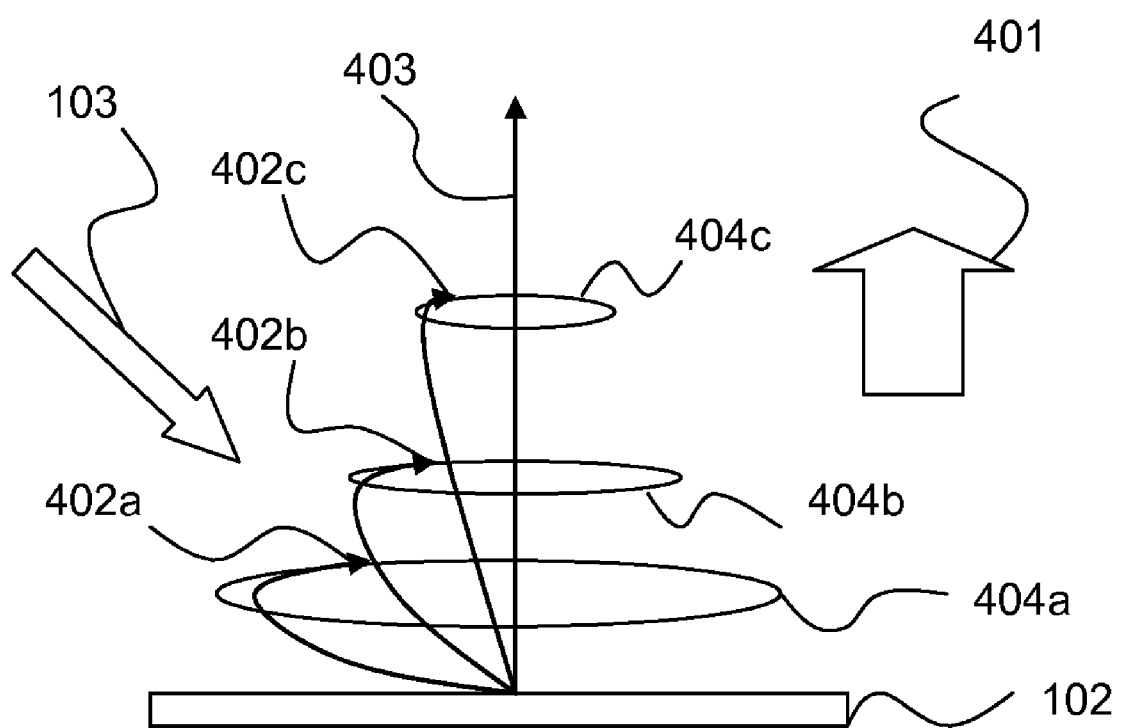
FIG. 4 illustrates the effects of angular distribution on the trajectories of electrons leaving a sample surface in a magnetic field.

FIG. 4 illustrates how photoelectrons are emitted from a point on the surface of a sample 102 by the action of the probe radiation 103. The sample 102 is sitting in a strong magnetic field with a direction 401 which is the same direction as the sample's normal 403. The coincidence of the directions is not a requirement of the operation of the projection lens. The photoelectrons are emitted at all angles typically with Lambert's cosine law and are illustrated here by three trajectories 402a,b,c at different angles to the sample's normal 403. The trajectories 402a,b,c are helices with diameters equal to the circles 404a,b,c respectively. It can be seen that for the trajectories 402a,b emitted at larger angles to the sample's normal 403, the diameters of the circles 404b,c are larger.

Figure 5:
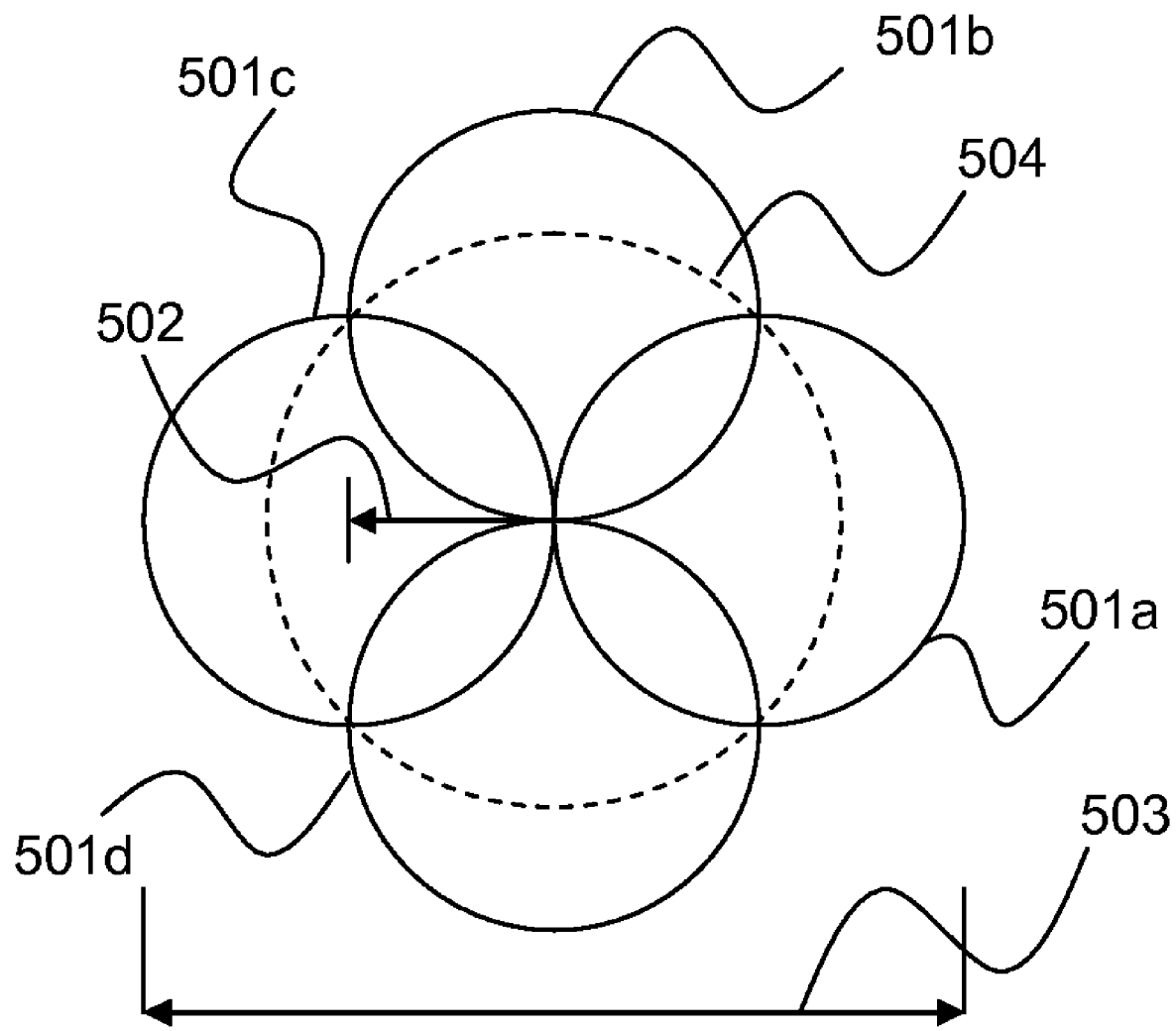
FIG. 5 illustrates how electron trajectories in a magnetic projection lens combine to limit image resolution.

The effect of the helical electron trajectories on the image resolution is illustrated by FIG. 5. Four circles represent in plane view helical trajectories 501a,b,c,d being emitted from a point on a sample. If the helical trajectories 501a,b,c,d are projected forward to an image plane they can intersect the image plane at any point in their cycle and thus form a disc of confusion that defines the resolution of the point. The helical trajectories have a maximum radius 502 that is dependent on the energy of the electrons, E, and the magnetic field B in the following relationship:

$$R_{max} = \frac{(2mE)^{\frac{1}{2}}}{eB}$$

From the geometry of FIG. 5 it can be seen that the maximum spread 503 of the electrons from a single sample point is four times the maximum radius 502. Where the distribution falls to 50% of the distribution peak will define the spatial resolution as a spatial response 504.

Figure 6:
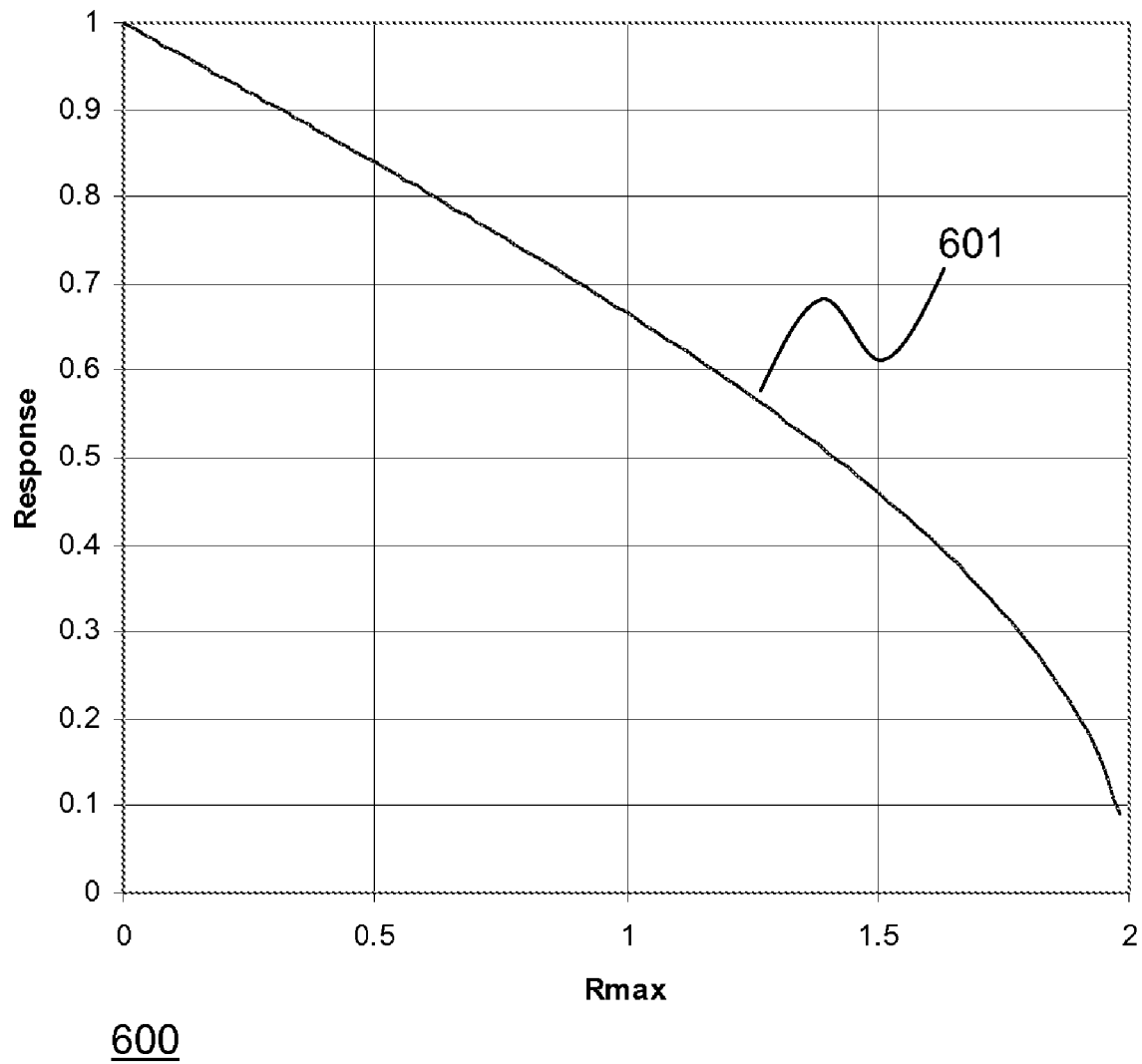
FIG. 6 shows the calculated response of emitted electron trajectories.

In FIG. 6 the plot 600 shows the response 601 of a single pixel from the center of the image of a point source out to twice the maximum radius, $R_{max}$. The half intensity point, when the response 601 is equal to 0.5, is at $1.4 R_{max}$. If the response 601 is convolved with Lambert's cosine law we get a triangular response. The spatial resolution will then be $2R_{max}$ after convolution.

Table 1 gives $R_{max}$ in microns, μ, for various radial electron energies in electron Volts, eV, and for two projection lens fields at the sample surface in Tesla, T.

TABLE 1

| Radial energy, eV | 2 T | 10 T |
|---|---|---|
| 0.00355 | 0.1μ | 20 nm |
| 0.088 | 0.5μ | 100 nm |
| 0.355 | 1.0μ | 200 nm |
| 1.0 | 1.7μ | 337 nm |

A field of 2 T is possible with a permanent magnet assembly while a field of 10 T would be obtained using a superconducting magnet. It can be appreciated that imaging electrons with an energy of more than a few electron volts a projection lens of the type described by Beamish et al. will not have submicron resolution even using a superconducting magnet.

One of the properties of the projection lens 200 is that it forms a real image along the whole of the throw. The resolution of the image also stays constant as the magnification changes. This means that there is a direct one to one correspondence with the image properties anywhere along the throw and the image at the surface of the sample 102. If the angles of the electrons can be limited anywhere along the throw then this has the same effect as limiting them at the sample 102.

The present invention uses a filter to remove the electrons that are emitted with large angles to the sample normal. The action of the filter leaves only those electrons which have small energies in the radial direction and therefore electrons that have a smaller $R_{max}$. If a filter is used to limit the exit angles from the surface then this implies that only top of the cosine distribution from Lambert's law is sampled and thus the resolution is $2.8 R_{max}$. Where $R_{max}$ is now defined by the filter limiting the cyclotron orbit radii.

In the preferred embodiment of the objective lens assembly 104, the limiting element 107 is a filter that limits the radii of the cyclotron orbits and thus improves the image resolution.

Figure 7:
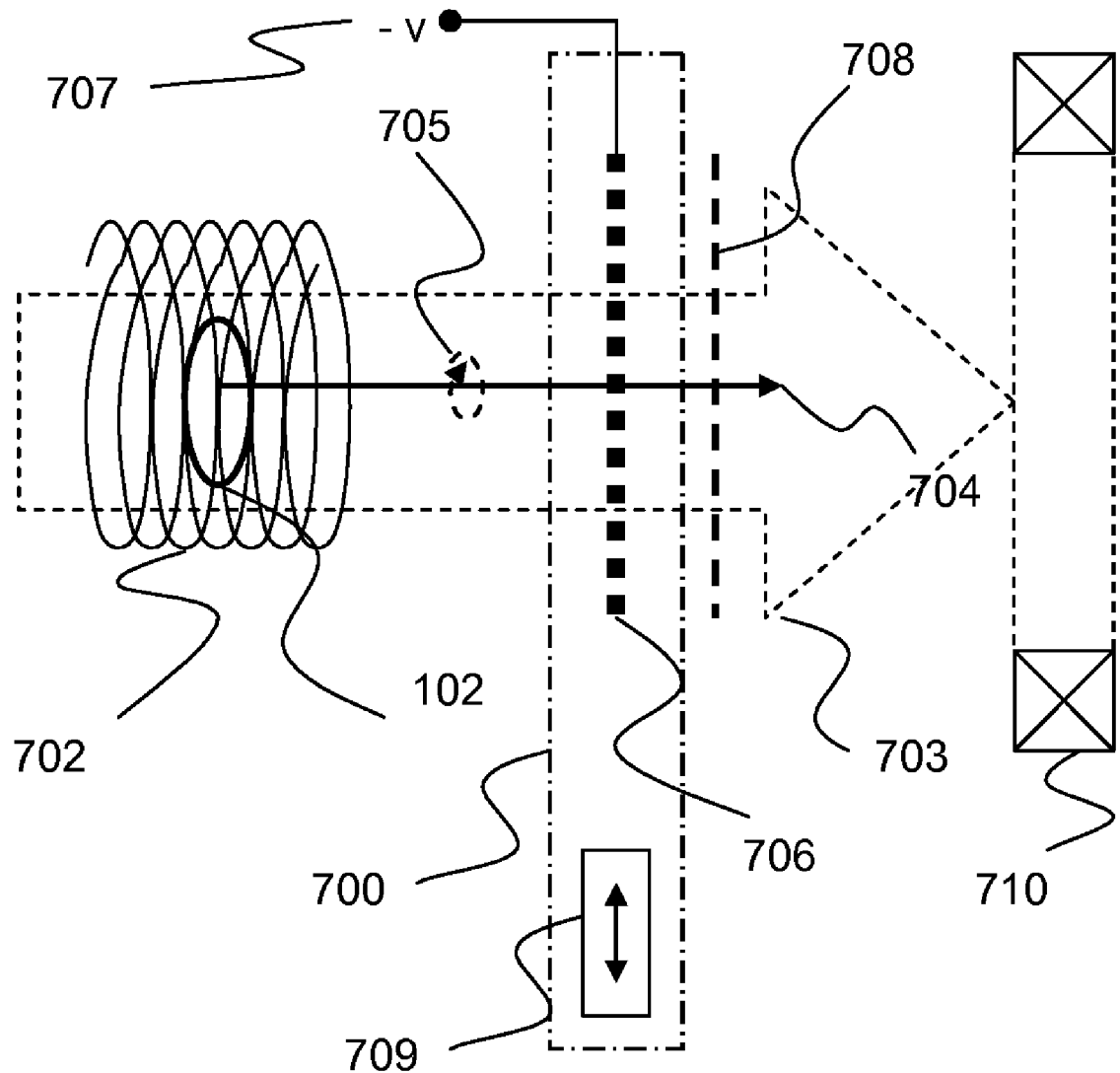
FIG. 7 shows the schematic of a cyclotron orbit radius filter and projection lens.

FIG. 7 is a schematic of the cyclotron orbit radius filter 700 and a projection lens arrangement. A sample 102 resides in a core magnet field created by an electromagnet 702. The electromagnet 702 creates a projection magnetic field 703 diverging from the axis 704 of the electromagnet 702. Electrons emitted from the surface of the sample 102 move within the projection magnetic field 703 with spiral orbits 705. Those electrons with the target energies, which might for example have chemically specific information, are decelerated by a first grid 706 that sits within the projection magnetic field 703 and has a negative potential 707 with respect to the sample 102. The deceleration leaves the target electrons with a small energy but still with a well defined forward direction along the magnetic flux lines. The electron radial energy remains the same. The radii of the spiral orbits 705 at the first grid 706 will depend on the emitted electron radial energy and the magnetic field strength of the projection magnetic field 703 where the first grid 706 is sited.

In the preferred implementation we fix the physical depth of the decelerating first grid 706 to be the distance that it takes an electron to do one cyclotron orbit at an energy which we will call here the filter pass energy. Thus, at the filter pass energy the orbits of the electrons must fit within the dimensions of the first grid 706 apertures or the electrons will not pass through. In the preferred implementation the depth of the first grid 706 is at least the electron forward velocity divided by the cyclotron frequency for those electrons of interest. The target electrons, those which are to be imaged, are decelerated to the filter pass energy. The filter pass energy is low so that the first grid 706 depth is reduced. The cyclotron frequency, ν, is given by the following formula:

$$\nu = \frac{eB}{2\pi m}$$

The cyclotron frequency is independent of radial energy. The electrons passing through the cyclotron orbit radius filter 700 are usefully accelerated to a higher energy by a second grid 708 to reduce the distorting effects of stray magnetic and electrostatic fields along the projection distance. The first grid 706 will act as a shadow mask over the image. The position of the first grid 706 must be dithered, either mechanically or electronically, to blur out the first grid 706 shadow. A dithering device 709 is used to change the position of the first grid 706 within the image field. The dithering device 709 may also be used to change the apparent position of the second grid 708 which may also introduce a shadow. The dithering device 709 can simply move the first grid 706 back and forward over a distance of several aperture spacings using an electromechanical or a piezoelectric actuator.

In FIG. 7 the cyclotron orbit radius filter 700 is shown to comprise a first grid 706 and a dithering device 709 residing in a projection magnetic field 703 created by a electromagnet 702. Alternatively, the actual field at the first grid 706 could be created by a permanent magnet or modified by the addition of a field from a secondary solenoid 710 or other source of magnetic field to tune the properties of the cyclotron orbit radius filter 700. Other sources of magnetic field can be sited at any position where they will influence the magnetic field at the first grid 706. Thus, in general the cyclotron orbit radius filter 700 comprises a plurality of retarding and accelerating grids, and a dithering device 709, residing in a magnetic field derived form a plurality of magnetic field sources.

Electrons emitted within a narrow range of total kinetic energy will have a radial energy distribution determined by their emission angle. This radial energy distribution will lead to a distribution in cyclotron radii of the spiral orbits. At the spatial filter the electrons are decelerated to the filter pass energy and as the forward distance for one cyclotron orbit is chosen to be similar to the depth of the grid, or the grid thickness, or the depth of the apertures in the grid, then by simple geometry only those orbits that have radii that are similar or smaller in size to the aperture size will be able to pass through the grid apertures.

Figure 8:
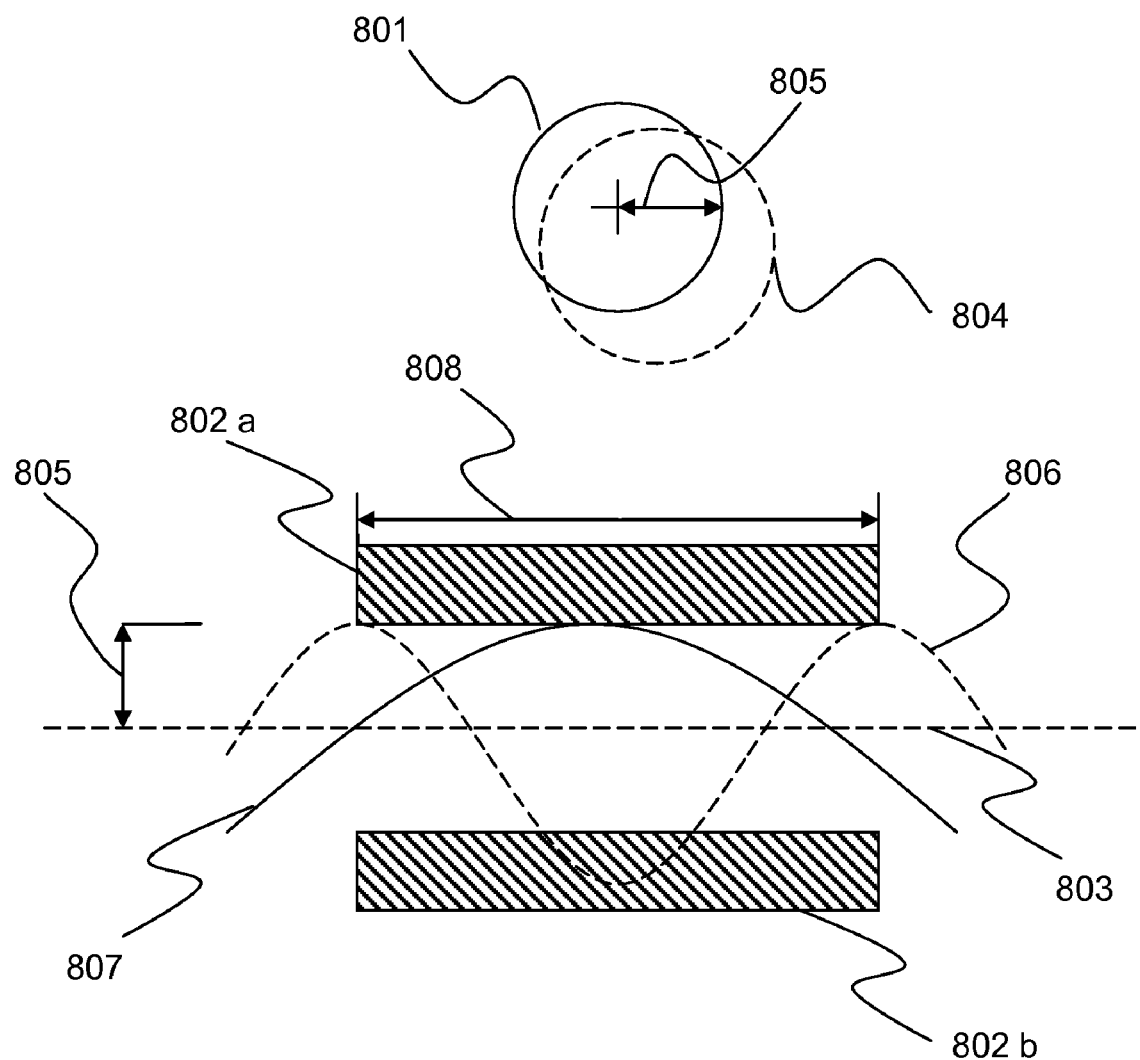
FIG. 8 illustrates the interaction of the electron cyclotron orbits with the depth of the grid apertures.

The interaction of the electron cyclotron orbits with the depth of the grid is shown in FIG. 8. An aperture in plane view is represented by a solid line circle 801, and in cross section by two hatched rectangles 802$a,b$ and an axis of rotational symmetry represented by a dashed line 803. A dashed circle 804 represents a cyclotron orbit with a radius larger than the radius of the aperture 805 in plane view and a dashed sine wave 806 and a solid sine wave 807 represent cyclotron orbits with a radius larger than the radius of the aperture 805 in cross section. The dashed sine wave 806 represents a cyclotron orbit that has an energy in the forward direction that gives it a wavelength, or repeat distance, that is equal to the grid aperture depth 808. The solid sine wave 807 has an energy in the forward direction that gives it a wavelength that is greater than the grid aperture depth 808. It can be seen that while a higher forward energy cyclotron orbit with a wavelength greater than the grid aperture depth 808 can pass through depending on the position of entry into the aperture, a cyclotron orbit with the same wavelength as the grid aperture depth 808 can only penetrate less than half way into the aperture. Cyclotron orbits with a radius less than the radius of the aperture 805 and with a wavelength equal to the grid aperture depth 808 will pass through the aperture depending on the position of the orbit entering the aperture. As electrons will be arriving randomly over the area of the aperture a distribution of the radii of those electrons passing through the gird will be created. The spatial resolution of a projected image formed after grid is dependent both on the distribution of the electron cyclotron radii from the sample, response 601, convolved with the geometry of the grid apertures, and on the relative dimensions of the grid depth and the cyclotron orbit wavelength.

Figure 9:
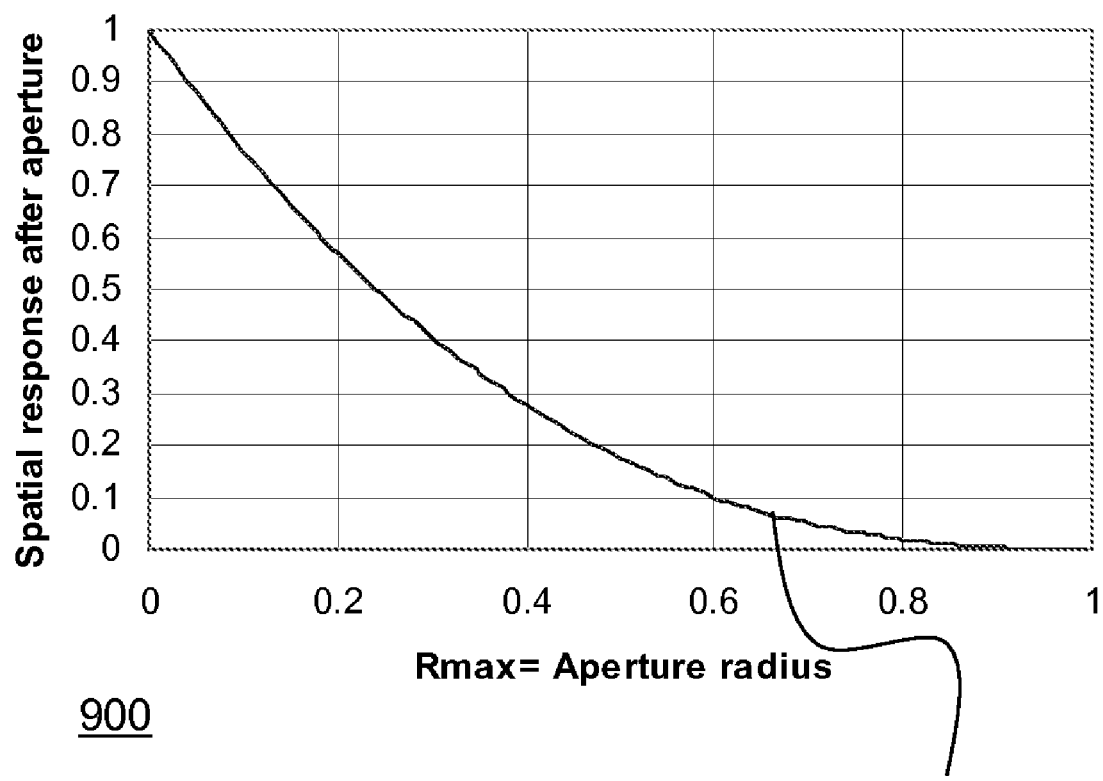
FIG. 9 shows the spatial response of a cyclotron orbit radius filter convolved with the response of emitted electron trajectories.

FIG. 9 shows a spatial response plot 900 of the convolution of cyclotron radii with circular grid apertures in the case of the forward distance of one cyclotron orbit being similar or smaller than the depth of the grid. The half width of the convolved response distribution 901 is at 0.24 of the grid aperture radius. The spatial resolution at the spatial filter is then twice 0.24 of the aperture radius or 0.24 of the grid aperture diameter. In the case of the forward distance for one cyclotron orbit that is greater than the depth of the grid there will be a slight degradation of the spatial resolution up to twice the grid depth, but a useful resolution can still be obtained when the grid depth is down to a single digit fraction of the cyclotron distance.

Figure 10:
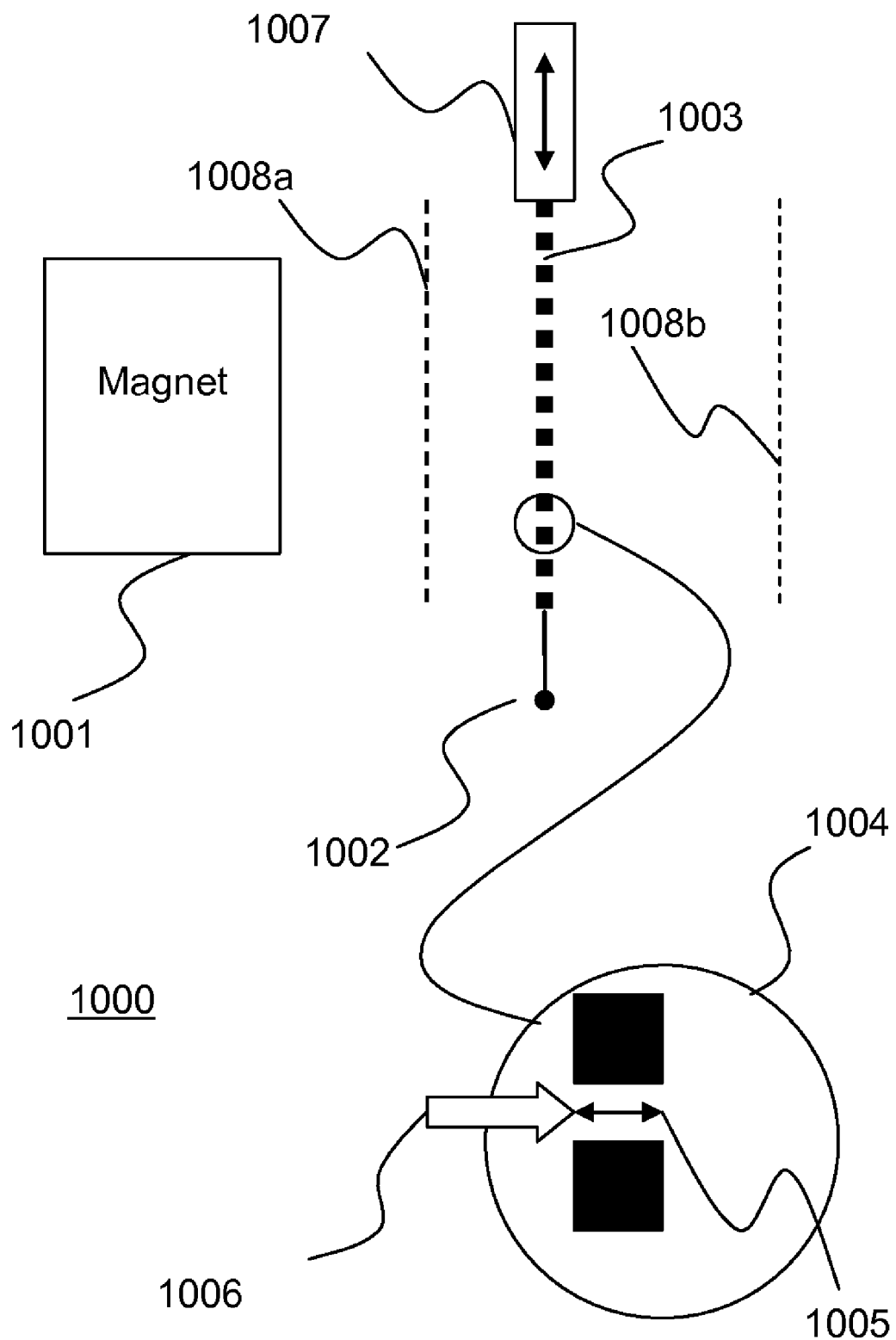
FIG. 10 shows the contributing elements required for the operation of the cyclotron orbit radius filter.

FIG. 10 shows the contributing elements 1000 to the operation of the cyclotron orbit radius filter 700. These contributing elements 1000 are: a magnet 1001, a source of electrical potential 1002, and a conducting plate 1003 connected to the source of electrical potential 1002 having a plurality of plate apertures 1004 with the plate aperture depth 1005 being approximately aligned to the local direction of the magnetic field 1006 and having the plate aperture depth 1005 similar to a single digit fraction or larger than a target electron cyclotron orbital periodic distance around a field line in the magnetic field produced by the source of magnetic field 1001, and a grid image position moving device 1007 to dither the apparent position of the plate apertures 1004 within the image field. We will refer to the conducting plate 1003 residing within a magnetic field at a defined electrical potential combined with the grid image position moving device 1007 with, and without, optional accelerating grids 1008$a,b$ as comprising the cyclotron orbit radius filter 700

To calculate the spatial resolution at the sample 102 given a spatial resolution at the cyclotron orbit radius filter 700 we must divide the spatial resolution at the sample with the magnification of the projection lens at the cyclotron orbit radius filter.

We give an illustrative example. We will base the example on a 0.2μ required spatial resolution. Starting with a 10 T field at the sample 102 we place the cyclotron orbit radius filter 700 at a field of 1 T along the projection magnetic field 703. The magnification at 1 T is thus ×3.16 and a 0.2μ resolution at the sample implies a spatial resolution at the cyclotron orbit radius filter 700 of 0.63μ. A resolution of 0.63μ at the cyclotron orbit radius filter 700 requires a grid aperture diameter of 2.6μ. The cyclotron frequency for a 1 T field is 2.8E+10 and at a filter pass energy of 0.25 eV a 10μ thick grid is required. This represents an aperture depth to diameter aspect ratio of 4:1 and is straightforward to produce. Going to a higher magnification does not give a gain in manufacturability of the grid. The magnification increases as the square root of the decrease in field and the grid thickness increases lineally with decreasing field.

A higher magnetic field at the sample 102 is an advantage because of the loss of signal associated with the cyclotron orbit radius filter 700. Only those electrons that have less than 3.55 meV radial energy in a 0.25 eV range near the target energy will be passed. This represents only a fraction of those electron emitted into 2π steradians. For 100 eV electron total energy:

Fraction passed at 2 T=2*(3.55E−03/1.0E02)^2=2.52E−09

Fraction passed at 10 T=2*(8.8E−02/1.0E02)^2=1.5E−06

The 10 T field gives $5^4$ times more current than the 2 T field and thus a high field superconducting magnet will be required for the highest spatial resolutions.

Grids for the cyclotron orbit radius filter 700 can be manufactured using a variety of methods. The grid in the illustrative example above with a 1 T magnetic field at the grid, a 2.6μ aperture diameter and 4μ depth can be produced using photolithography and the conventional techniques of semiconductor fabrication. Given a lower magnetic field at the grid, for example 0.1 T, and pass energy of 0.25 eV an aperture depth of 100μ is required. A hexagonal array of close packed 10μ diameter apertures can be manufactured in a metal foil of 100μ thickness using laser cutting. An array of 10μ apertures at 0.1 T gives a spatial resolution of 0.5μ at the sample 102 in a 2.3 T field.

The cyclotron orbit radius filter 700 is a high pass energy filter. Charged particles with energy less than the retarding potential 707 on the filter first grid 706 will be reflected back to the sample. Charged particles with an energy higher than the retarding potential 707 will pass through the filter grid. Those charged particles with energies within the pass energy of the cyclotron orbit radius filter 700 will be filtered and only those radii that are smaller than the filter radius at that magnetic field strength will be transmitted.

Electrons with more than ten times the pass energy will pass through the filter will little attenuation as their cyclotron orbits will be helical with a much longer cycle than the filter grid thickness. If those higher energy charged particles are a large fraction of the total charge particle current transmitted though the grid and reaching the detector assembly 111 then the higher spatial resolution information contained in the charged particle signal within the pass energy will most likely drive the output from the detector assembly 111 into saturation or add a large shot noise contribution to the desired signal. For this reason the cyclotron orbit radius filter 700 is optimally operated in association with either an energy analyzer in the image output assembly 108 that rejects all charged particles excepting those with an energy that is a small multiple of the pass energy, or the cyclotron orbit radius filter 700 is operated with a sample and illumination source that limits the production of charged particles with energies above the region of interest.

If the cyclotron orbit radius filter 700 is operated with a sample and illumination source that limits the production of electrons with energies above the region of interest, then a simple charged particle image detector can be placed within the axial field at a point where the magnification of the lens is as defined by equation 1. Such a sample and illumination source is a photoelectron source producing secondary electrons near the Fermi energy of a solid.

The Fermi energy in a solid is the energy of those electrons that have the minimum binding energy in the solid. These electrons with a minimum of binding energy are the conduction electrons in a metal or the valency electrons in an insulator. If the pass energy of the cyclotron orbit radius filter 700 is arranged to be at the difference in energy between the photoelectron energy and the binding energy of the Fermi energy then those electrons emitted from the Fermi level will be imaged at high spatial resolution. As there are no photoelectrons with higher energy, the Fermi energy being the lowest binding energy, then there is no other contribution to the signal.

Figure 11:
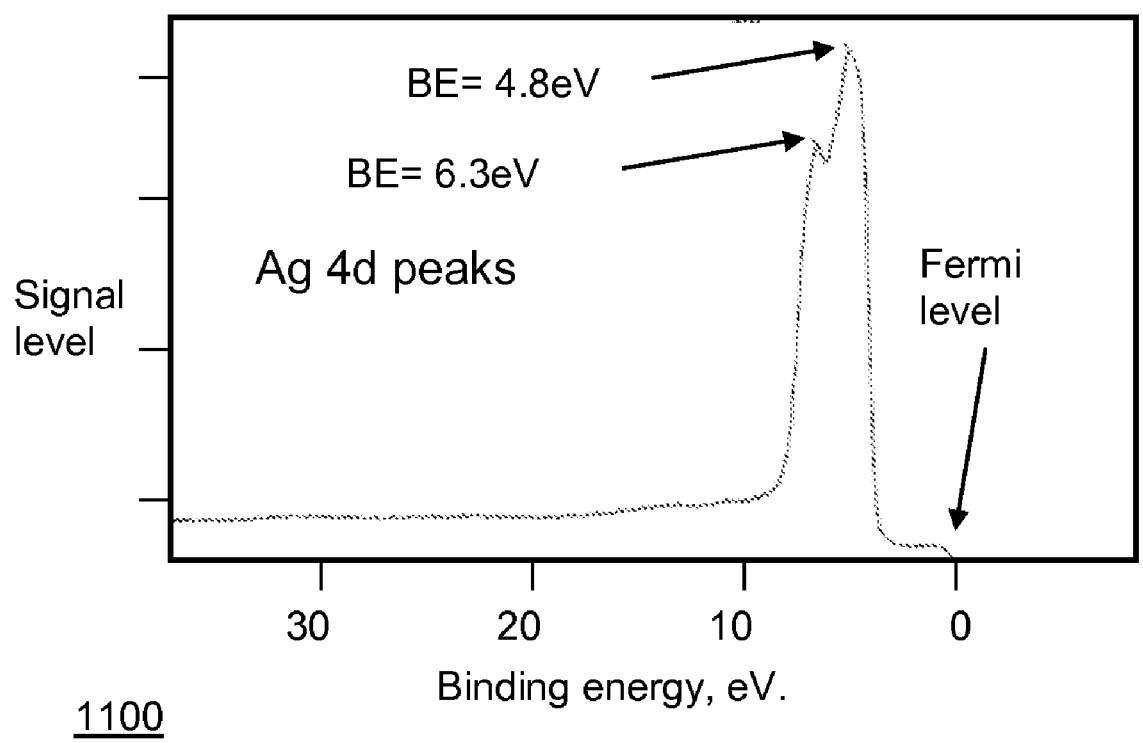
FIG. 11 shows a plot of the photoelectron spectrum near the Fermi level for silver.

FIG. 11 shows an electron distribution plot 1100 of the signal level from an X-ray photoelectron spectrometer representing the photoelectron electron distribution near the zero of binding energy of electrons in a clean silver sample and includes the response from the silver $4d$ electron levels. It can be seen that the signal level cutoff at the Fermi energy defines the zero of binding energy in the electron distribution plot 1100. Spatial variations in the Fermi level will cause contrast in the emitted electrons at any energy and these can be imaged. Variations can be caused by differences in binding energy due to surface crystal lattice orientation, variations in surface chemistry, or variations in potential such as in an active electronic device.

Figure 12:
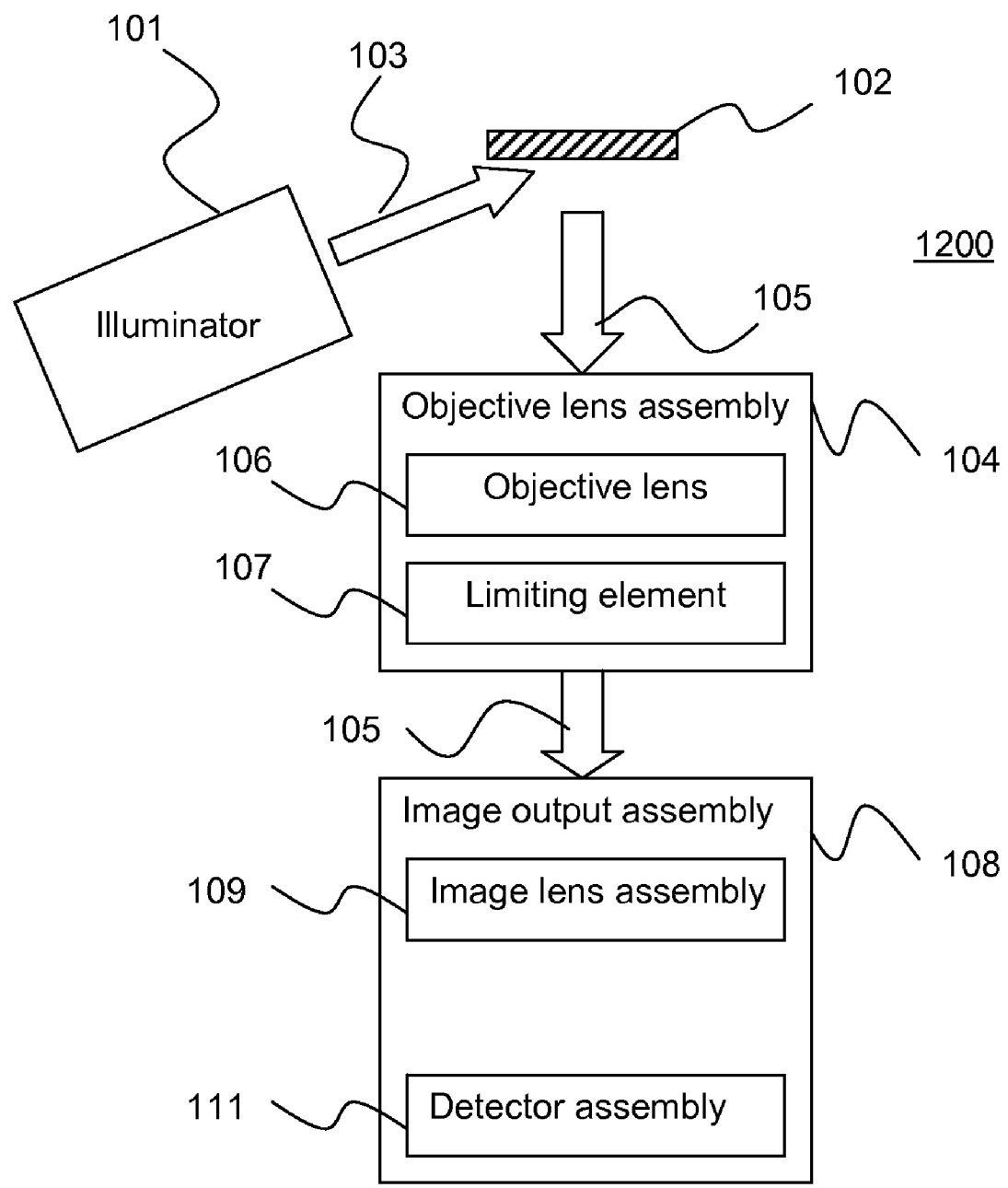
FIG. 12 is a block diagram illustrating the parts of a projection electron microscope without an electron analyzer.

FIG. 12 shows a block diagram of a photoelectron microscope 1200 which is an embodiment of the invention that can be used to image electrons emitted from or near the Fermi level of a solid. FIG. 12 shows the photoelectron microscope 1200 comprises: illuminator 101, sample 102, objective lens assembly 104 with sub-elements objective lens 106 and limiting element 107, image output assembly 108 with a sub-element the detector assembly 111 and an optional sub-element an image lens assembly 109 without any requirement for an analyzer assembly 110. This embodiment would in particular have: for the illuminator 101 an effectively monochromatic photon source with energy sufficient to excite electrons out of the Fermi level, these photons would be typically greater than several eV so that a UV laser would be suitable, for the objective lens 106 a magnetic projection lens 200, for the limiting element 107 a cyclotron orbit radius filter 700, and the detector assembly 111 which includes an electron sensitive imaging detector 1201. As will be clear to someone ordinarily skilled in the art there are a variety of electron sensitive imaging detectors 1201. These detectors would include a phosphor screen at a positive potential with a camera imaging the electron induced phosphorescence.

Figure 13:
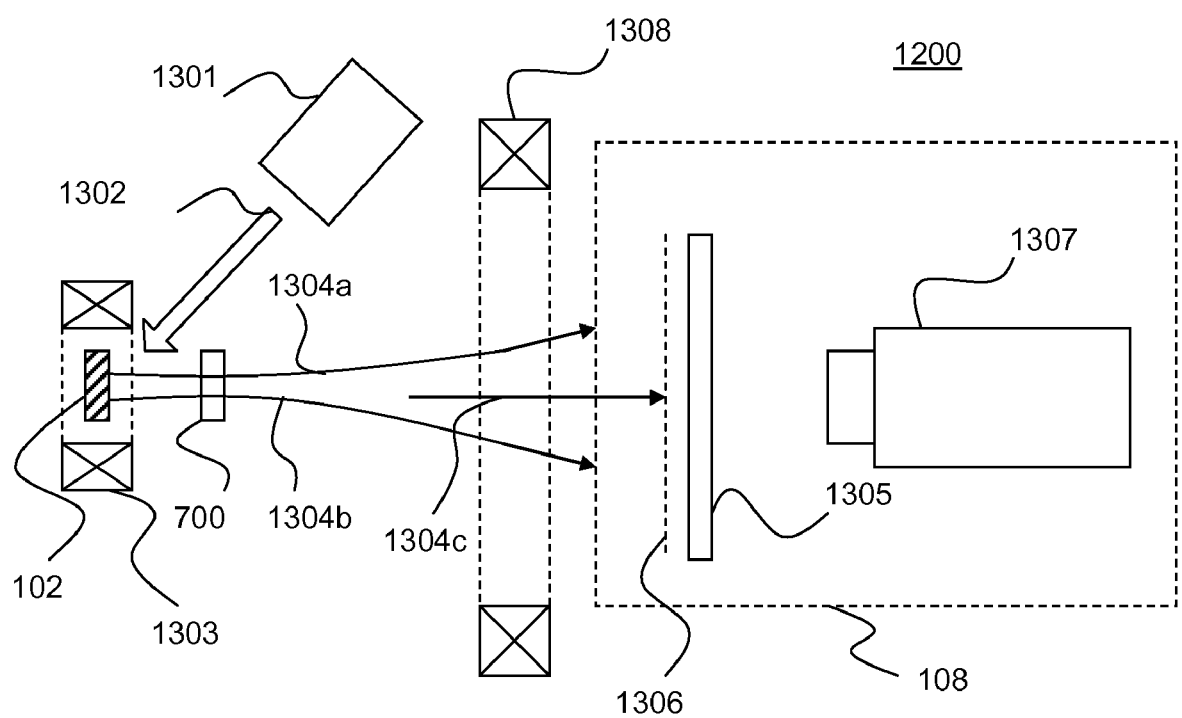
FIG. 13 is a schematic diagram illustrating the parts of a projection electron microscope with a cyclotron orbit radius filter.

FIG. 13 shows a schematic of a photoelectron microscope 1200. A source of effectively monochromatic photons 1301 provides a beam of photons 1302 which is incident on a sample 102. An objective lens 106 is created by a source of magnetic field such as a superconducting solenoid 1303 with the sample 102 on axis at the center of the solenoid. A cyclotron orbit radius filter 700 with optional modifying grids is placed in the magnetic field in front of the sample 102. Fermi level photoelectrons with trajectories 1304a,b,c are projected by the magnetic field onto a two dimensional detector 1201 which is shown as a phosphor plate 1305 with an accelerating grid 1306 in front of a camera 1307. An optional field coil 1308 is used to change the magnification of the microscope by changing the ratio of the magnetic fields at the sample 102 and the phosphor plate 1305.

Figure 14:
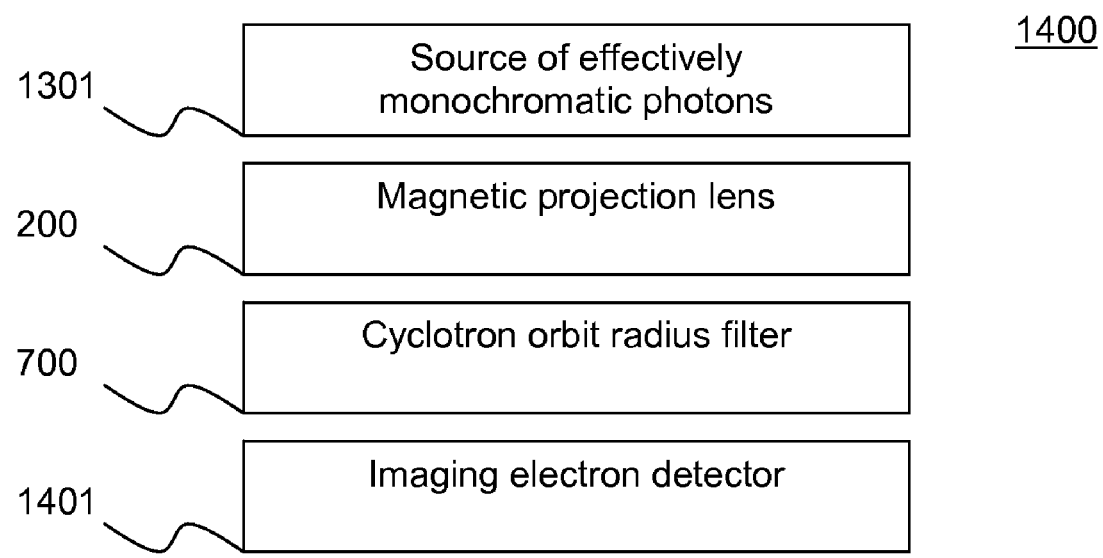
FIG. 14 is a block diagram illustrating the most basic arrangement of an electron microscope with a cyclotron orbit radius filter.

FIG. 14 further defines the microscope elements 1400 comprising an electron microscope using a cyclotron orbit radius filter 700. The base arrangement 1400 comprises a source of effectively monochromatic photons 1301, a magnetic projection lens 200, a cyclotron orbit radius filter 700, and an imaging electron detector 1401.

The descriptions of the photoelectron microscope 1200 incorporating a cyclotron orbit radius filter 700 define a new class of electron microscope that has high spatial resolution and high imaging speed. As will be seen below the photoelectron microscope 1200 can also be combined with other electron optical devices and can be made very compact and relatively inexpensive.

As explained above, electrons with more than ten times the pass energy of the cyclotron orbit radius filter 700 will pass through the filter and either saturate the detector or add unacceptable shot noise to the signal. For this reason the cyclotron orbit radius filter 700 is usefully operated in association with an electron energy analyzer in the image output assembly 108 that rejects all charged particles excepting those with an energy that is a small multiple of the pass energy. The electron energy analyzer must be an imaging analyzer to preserve the image.

To use a projection lens 200 with an electron analyzer 110 requires that the field of the projection lens 200 does not interfere with the electron analyzer 110 operation. In the case where the electron analyzer 110 is a simple high pass energy filter consisting of a retarding grid in front of the two dimensional electron detector 1401 such as was used by Pianetta et. al. then the field from the projection lens 200 aids the operation of the electron analyzer 110. However, for any electron energy analyzer that is a low pass or band pass energy filter the magnetic field from the projection lens 200 will interfere with the operation of the electron energy analyzer and thus the field must be terminated before the electrons reach the analyzer. Kim et. al. use a magnetic grid to terminate the field from the projection lens 200 but this is not satisfactory and causes distortion in the image that is substantially greater than 1 micron. The present invention terminates the field of the projection lens 200 a manner that reduces the distortion of the image.

Figure 15:
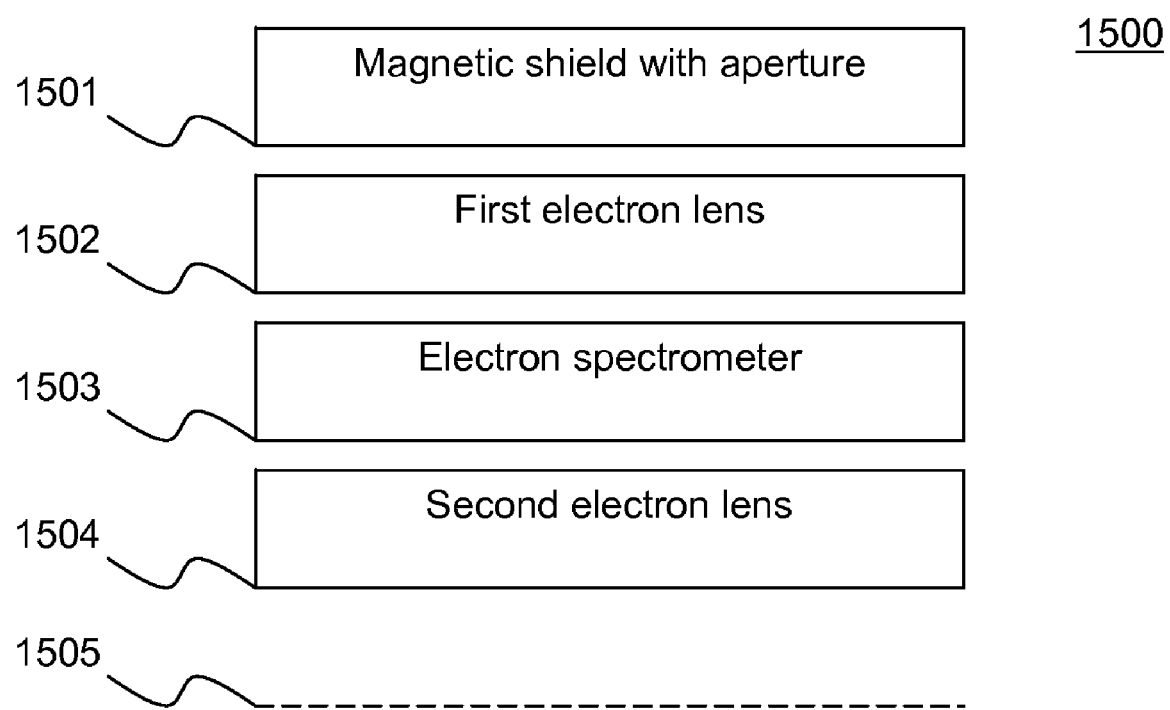
FIG. 15 is a block diagram of a field terminating imaging electron energy analyzer.

FIG. 15 shows a block diagram of a field terminating imaging electron energy analyzer 1500. The field termination imaging electron energy analyzer 1500 comprises four elements: a magnetic shield with an aperture 1501, a first electron lens 1502, an electron spectrometer 1503, and a second electron lens 1504. The input into the field terminating imaging electron energy analyzer 1500 is a real projected electron image in a magnetic field and the output of the field terminating imaging electron energy analyzer 1500 is a real image focused onto the focal plane 1505 in field free space.

Figure 16:
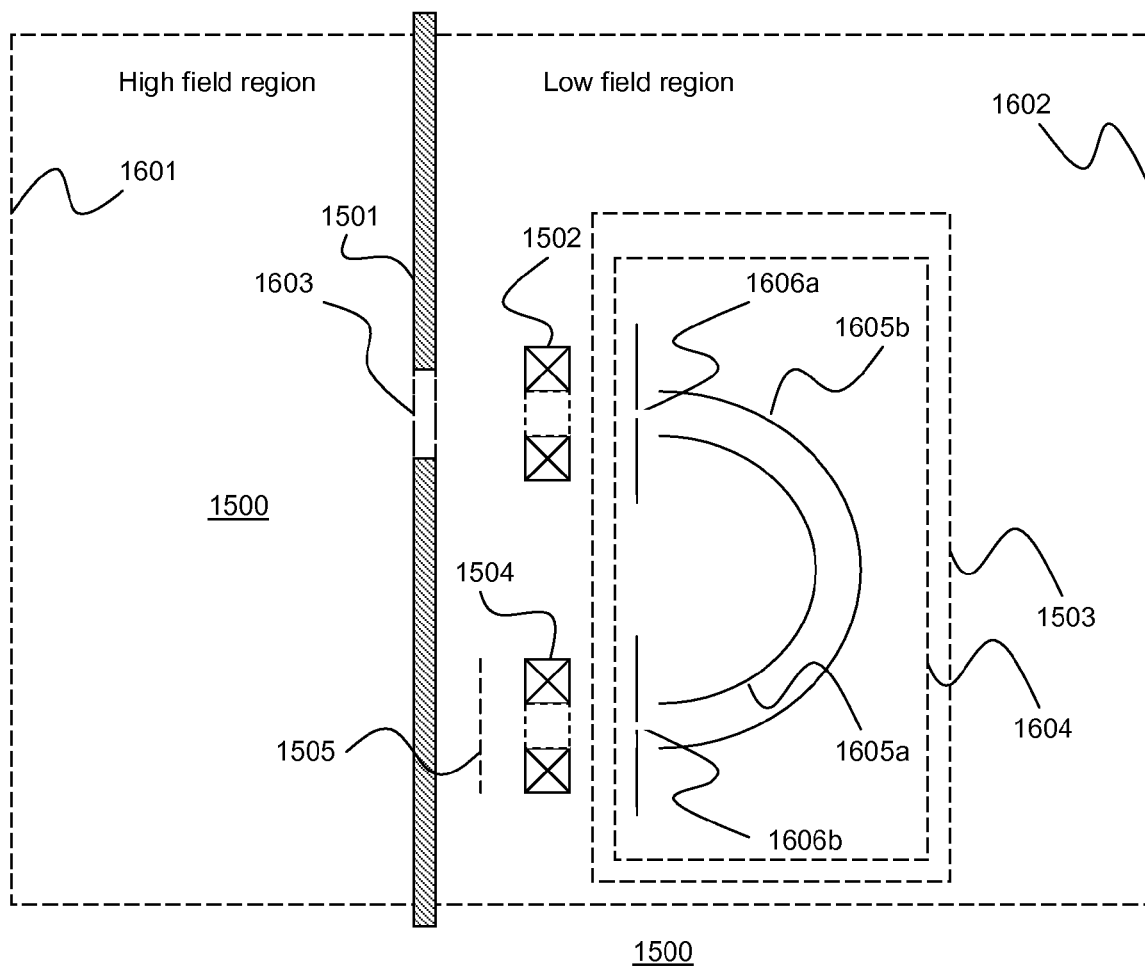
FIG. 16 shows the schematic of a field terminating imaging electron energy analyzer.

FIG. 16 shows a schematic of a field terminating imaging electron energy analyzer 1500. The magnetic shield with an aperture 1501 is shown as a flat plate but more typically would be a box with several layers enclosing the field sensitive region of the electron spectrometer 1503. The magnetic shield with an aperture 1501 is shown as separating two regions, one a high field region 1601 and the other a low field region 1602, and having an aperture 1603 between the regions. The electron spectrometer 1503, the first electron lens 1502, the second electron lens 1504 and the focal plane 1505 are situated in the field free region 1602. A detector, such as a electron sensitive imaging detector 1401, would be sited at the focal plane 1505. The electron spectrometer 1503 must discriminate against electrons that are higher in energy than one or two multiples of the pass energy of the cyclotron orbit radius filter 700, plus any accelerating voltage that has been supplied to the electrons from the accelerating grid 1008b. The field terminating imaging electron analyzer 1500 is therefore necessarily at a different electrical potential to the cyclotron orbit radius filter 700 and the sample 102. To discriminate against higher energy electrons requires that the electron spectrometer 1503 be either a low pass or a band pass analyzer. In our preferred implementation the electron spectrometer 1503 is a concentric hemispherical analyzer, a CHA 1604, which comprises two concentric hemispheres 1605a,b and an input slit 1606a and an output slit 1606b. The concentric hemispheres 1605a,b are arranged to have a differential electrical potential such that electrons focused into the input slit 1606a with the correct energy, the CHA 1604 pass energy, are brought to a focus at the output slit 1606b by the action of the potentials on the concentric hemispheres 1605a,b. More particularly a CHA 1604 has the useful property of being double focusing. The CHA 1604 focuses both in the dispersion plane and in the non-dispersion plane. This implies that a virtual image focused into the input slit 1606a will be focused as a virtual image at the output slit 1606b.

Figure 17:
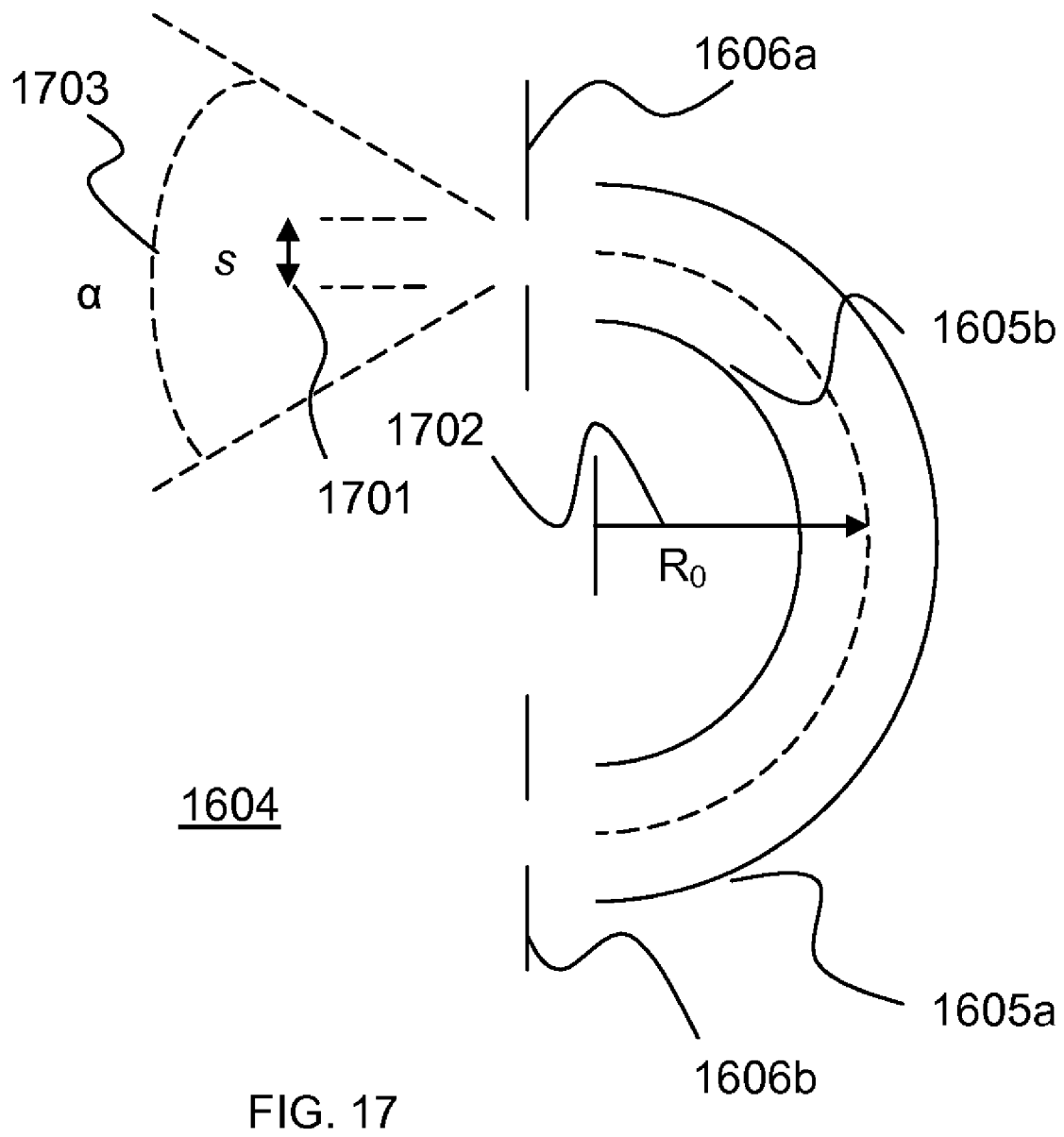
FIG. 17 illustrates the energy resolution of a CHA.

FIG. 17 illustrates the resolving power of a CHA 1604. The resolving power, ρ, is:

$$\frac{1}{\rho} = \frac{\Delta E}{E} = \frac{s}{2R_o} + \alpha^2$$

Where E is the energy of the electrons passing through the input slit 1606a and the output slit 106b, s is the slit size 1701 in the dispersive direction, $R_o$ the central orbit radius 1702, and α the maximum angle 1703 of the electrons entering the input slit 1606a.

The essential difficulty with the field termination is that when the projected image is passed through a simple aperture in a soft ferromagnetic magnetic material the fringing fields created by the magnetic field cause a large astigmatism to be created in the image. It is this difficulty that the invention of the field terminating electron analyzer 1500 solves.

The method of field termination disclosed herein requires understanding of the electron optical properties of the actual field terminating elements and the electron energy analyzer. These electron optical properties are made apparent from calculations made using a finite element field and ray tracing software program from Field Precision Corporation of NM USA. The results of calculations shown herein are representative of the electron optical properties of a range of possible physical arrangements. As will be apparent to someone ordinarily skilled in the art a wide range of modifications can be made to the physical arrangement present herein to produce better or worse results. The example of the electron optical arrangement described herein uses a principle that applies over a range of physical implementations.

Figure 18:
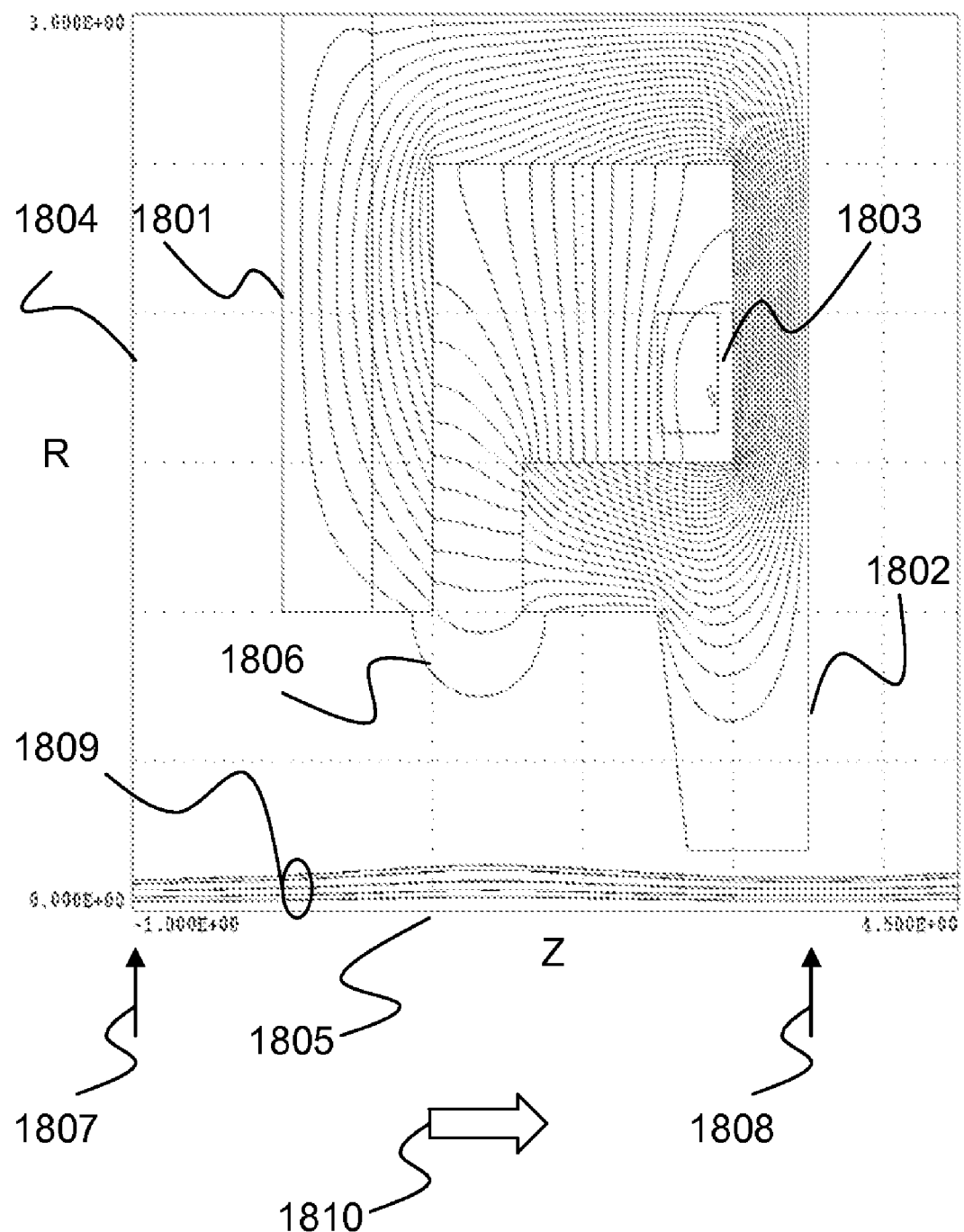
FIG. 18 shows the results of electron optical calculations on a field termination and electron lens.

FIG. 18 shows results of electron optical calculations for a field terminating ferromagnetic plate with an aperture 1801 and a magnetic electron lens 1802. The magnetic electron lens is excited by a lens coil 1803. The shape of the ferromagnetic plate with an aperture 1801, the magnetic electron lens 1802, and the lens coil 1803 in the radial direction, R, 1804 are cylindrically symmetric around the Z axis 1805. The scale along the radial direction, R, 1804 and the Z axis 1805 is in centimeters. There is a field of 10 G (Gauss) at the first point 1807 on the Z axis 1805 and a field of less than 10 mG at the second point 1808. The ferromagnetic plate with an aperture 1801 acts as a field termination for the field of 10 G. A group of electron trajectories 1809 are calculated for an initial velocity of 25 eV with an initial direction 1810 directly along the Z axis 1805 at several different starting positions along the radial direction 1804. It would be expected that the action of the magnetic electron lens 1802 would bring the group of electron trajectories to a point, or focus, somewhere along the Z axis 1805. As can be seen from looking at shape of the group of electron trajectories 1809 along the Z axis 1805 that there is no sharp focus and only a vague waist is formed.

Figure 19:
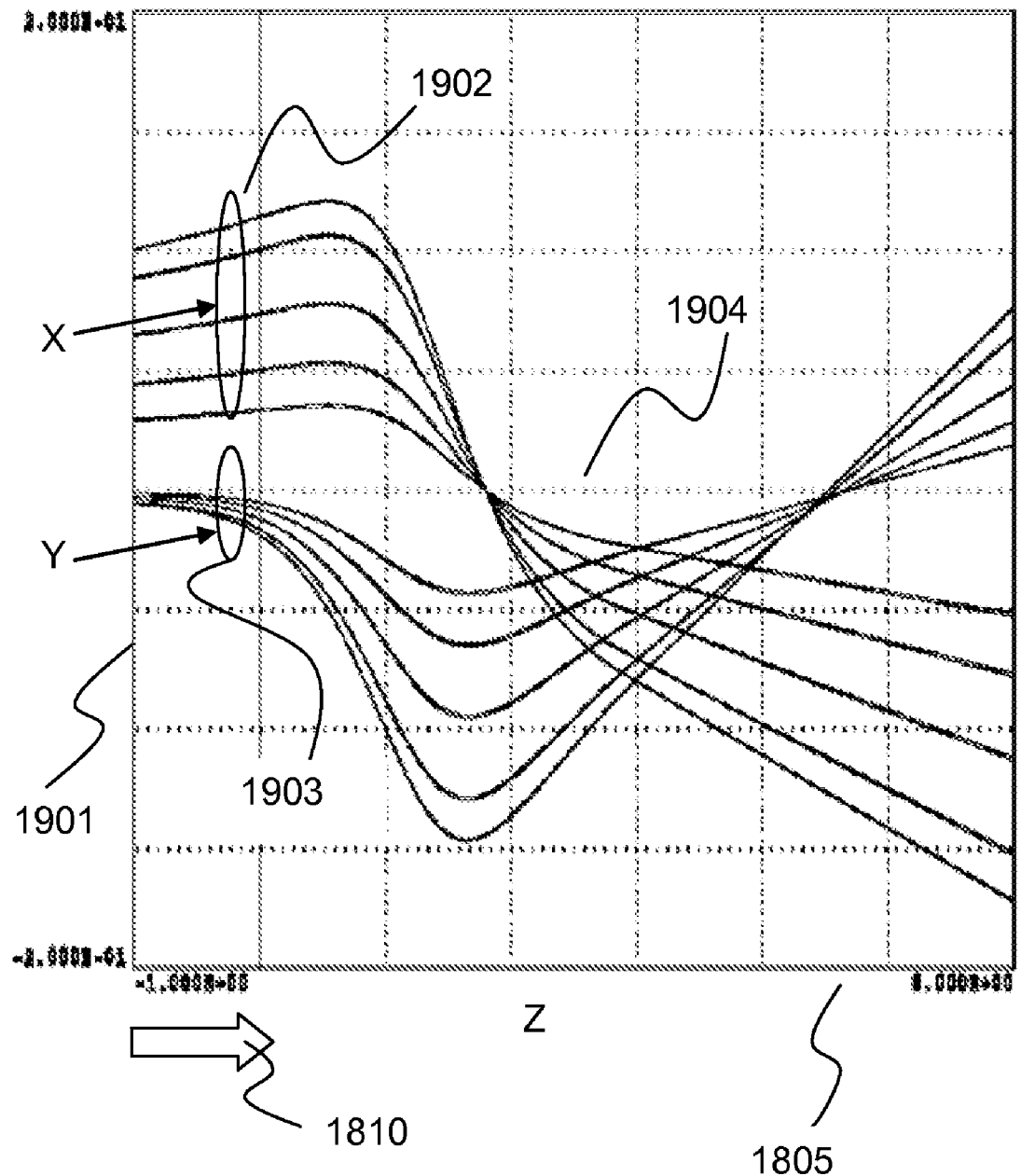
FIG. 19 shows the results of electron optical calculations on a field termination and electron lens resolved into X and Y components.

FIG. 19 shows the same group of electron trajectories 1809 but resolved into components along the combined XY axis 1901. The X distance components 1902 can be seen to focus at a different position to the Y distance components 1903 along the lens axis 1904. The difference between the focal properties along the two directions explains the very poor focal properties seen in FIG. 18. From the electron optical calculations shown in FIG. 18 and FIG. 19 it can be seen that the terminating the projection lens field 200 field with a magnetic shield with an aperture 1501 causes a very large focal aberration, similar to astigmatism, so much so that the value of the image would appear to be effectively destroyed as it enters the input slit 1606a and is refocused onto the exit slit 1606b.

Surprisingly, re-projecting the electrons passing through the CHA exit slit 1606b the angular distribution can be focused onto a detector plane as a real image in field free space. The individual pixels are focused and the astigmatism simply gives an image rotation. The serendipity of this fact is an innovation in the field of imaging spectrometers. Those ordinarily skilled in the art of electron optics will appreciate that this result is not obvious and ray tracing of the electron paths through the system is required to demonstrate it.

Figure 20:
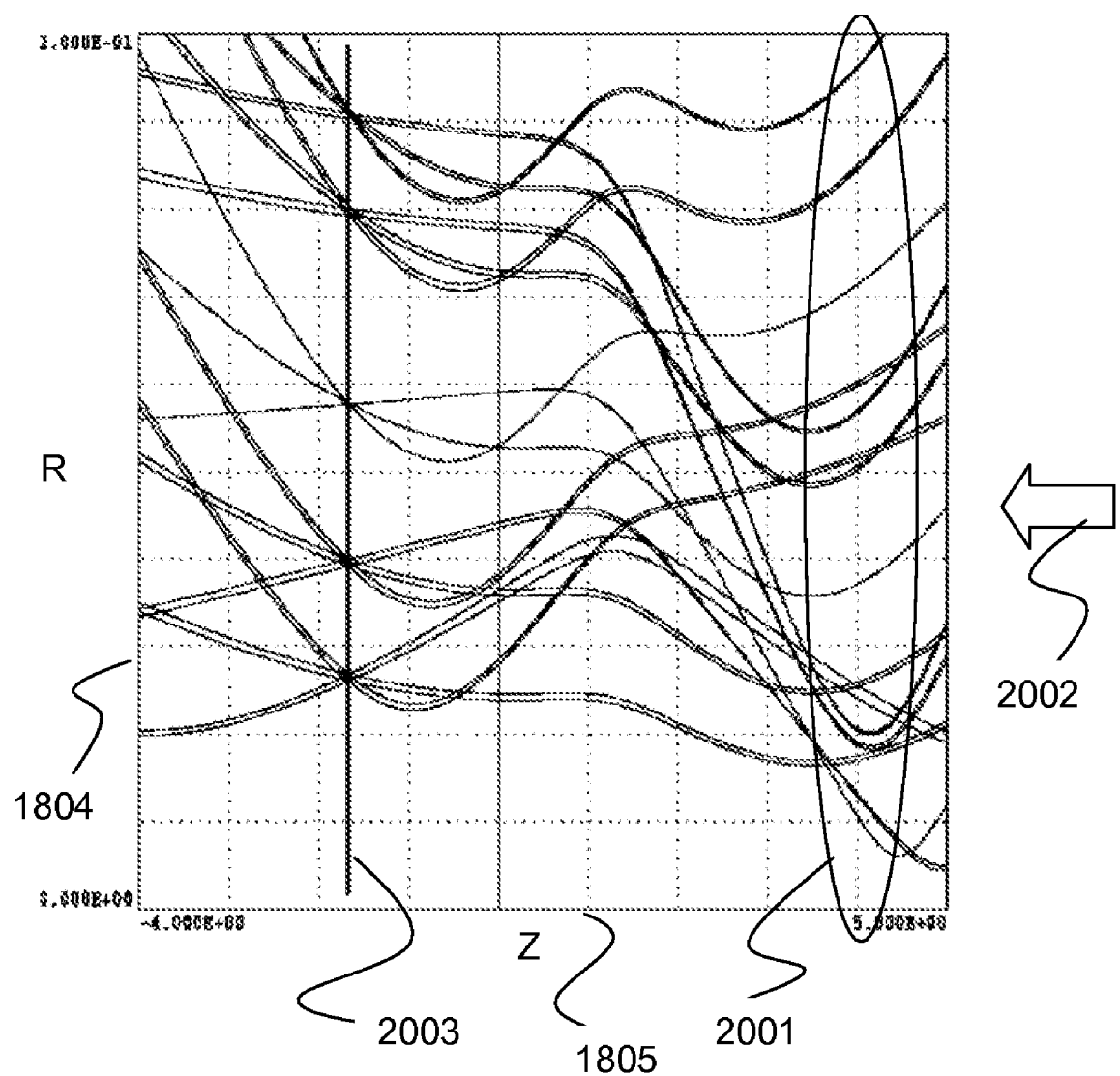
FIG. 20 shows the shows the results of electron optical calculations of a CHA output lens.

FIG. 20 shows an energy resolved group of electron trajectories 2001 that are at the output slit 1606b. This energy resolved group of electron trajectories 2001 are moving in the direction indicated by the block arrow 2002. The energy resolved group of the electron trajectories 2001 are similar to the group of electron trajectories 1809, after focusing and energy resolving but with a distribution of electron energies that produce a scatter of the trajectories at the output slit 1606b. A second electron lens 1504, which is not shown, but with the same geometry as the magnetic electron lens 1802 focuses the energy resolved group of the electron trajectories 2001 at a single line 2003 which is equivalent to the focal plane 1505.

In FIG. 20 the radial geometry is symmetric about the Z axis 1805. The energy resolved group of the electron trajectories 2001 are double trajectories with a spacing equivalent to a single pixel. The energy resolved group of the electron trajectories 2001 have been deflected both in the positive and negative energy dispersion directions by the distance of the aperture slit half width so that three double trajectories form the image. The electrons pass through the CHA 1604 and are deflected into positive and negative dispersion directions depending on their energy about the pass energy. The exceptions are the center trajectories which are singletons. The double trajectories are resolved at the single line 2003 with the three energy resolved paths crossing. The single line 2003 is equivalent to the focal plane 1505. As there is a slight curvature in the focal position at the single line 2003 the trajectories are better resolved near the axis.

In these trajectory simulations we have fixed upon a 25 eV pass energy and a 200 line solution with a terminating field of 10 G at the aperture. We have also fixed upon a cyclotron radius filter 700 pass energy of 0.25 eV. A 0.25 eV window implies $\rho=100$ at a CHA pass energy of 25 eV. In this application the angle is low but not negligible. With 100 mm radius hemispheres we require 1.5 mm slits and an angle of less than 0.05 radians. The X and Y components 1902 and 1903 are treated separately to calculate the spectrometer response. The optimum spectrometer aperture must be a slit with at least a 1.4:1 aspect ratio. Because of the focusing astigmatism the choice of a CHA radius of 100 mm is the limiting factor on the number of pixels in the image.

The electron lenses shown here in the preferred implementation are magnetic lenses but electrostatic lenses can also be used. It will be apparent to someone ordinarily skilled in the art that different choices can be made with respect to the parameters in the calculations presented herein without departing from the essence of the invention.

Figure 21:
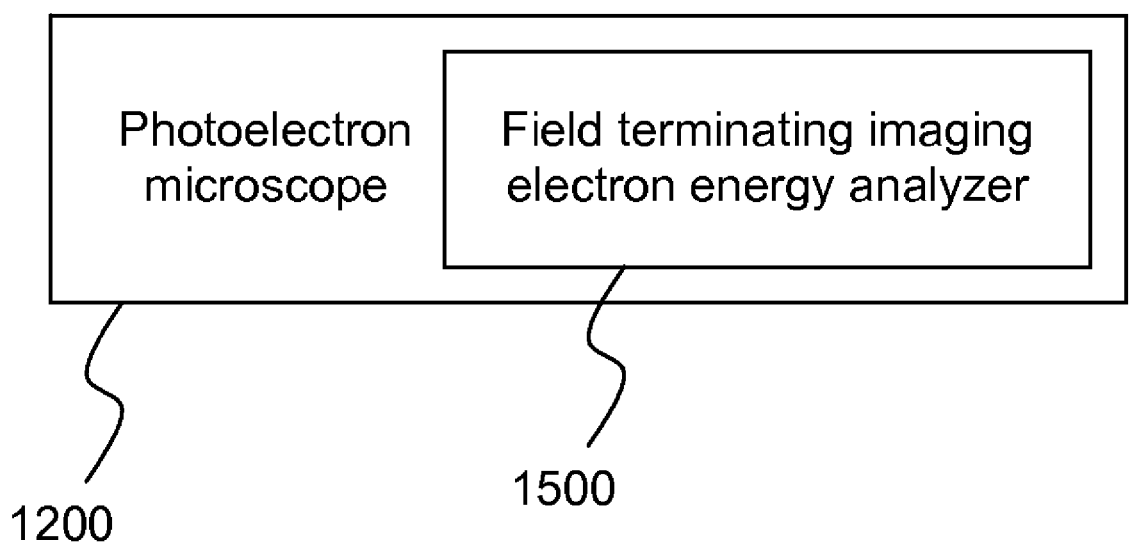
FIG. 21 shows a bock diagram of a photoelectron microscope with energy resolved imaging.

FIG. 21 shows a block diagram of a photoelectron microscope with energy resolved imaging 2100. The photoelectron microscope with energy resolved imaging 2100 is comprised of the photoelectron microscope 1200 and a field terminating imaging electron energy analyzer 1500.

Figure 22:
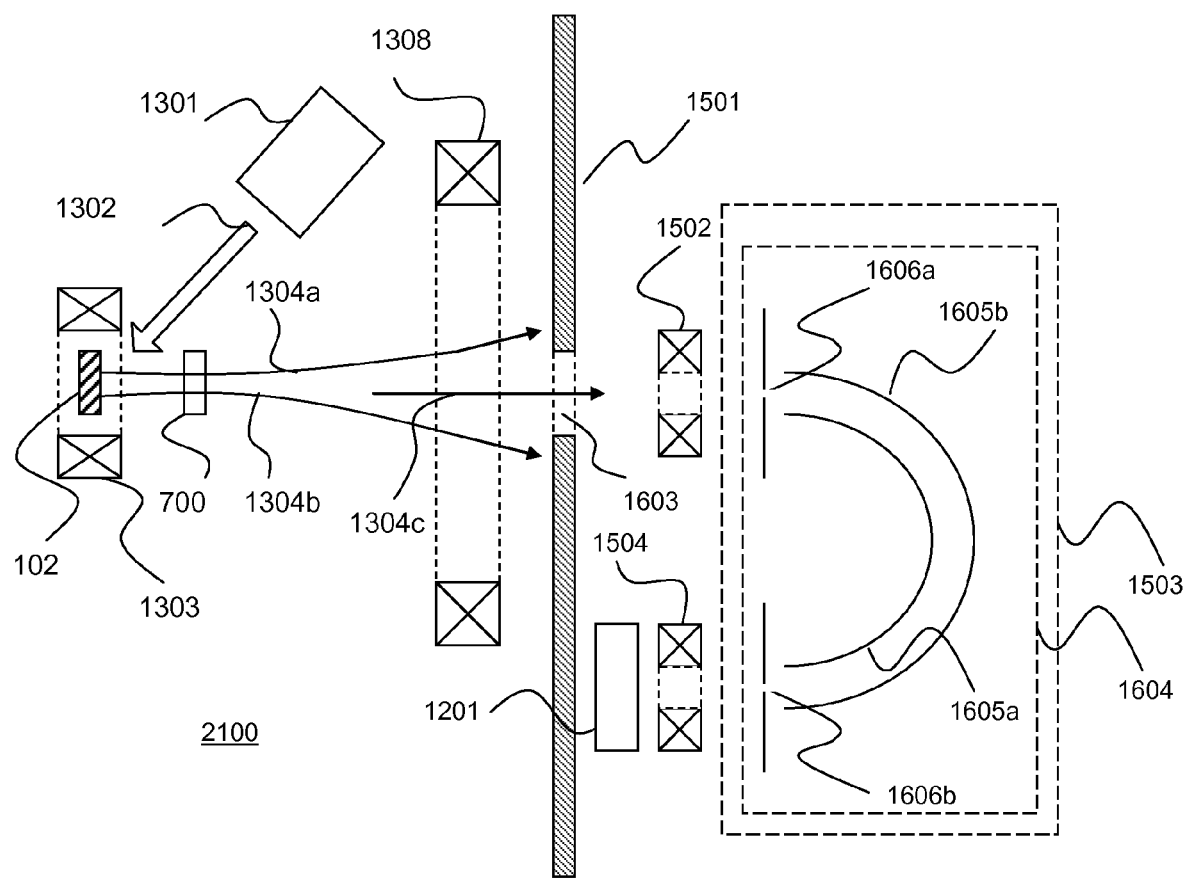
FIG. 22 shows a schematic of a photoelectron microscope with energy resolved imaging.

FIG. 22 shows a schematic of the photoelectron microscope with energy resolved imaging 2100. From the schematic FIG. 22 it can be seen that the field terminating imaging electron energy analyzer 1500 is in the electron optical path between the field coil 1308 and the electron sensitive imaging detector 1201 of the photoelectron microscope 1200. The photoelectron microscope with energy resolved imaging 2100 can be used for high spatial resolution UV and XPS imaging and spectroscopy with a variety of photon sources. These photon sources could include a UV laser and X-ray sources such as a monochromatic beam line from a synchrotron.

As has been discussed above it is useful for the operation of the projection lens 200 acting with the cyclotron orbit radius filter 700 to have as strong as possible magnetic field at the sample. However, the use of superconducting magnets is prohibitively expensive in some applications. Superconducting magnets are also bulky as they require cryostats and a source of liquid helium.

Figure 23:
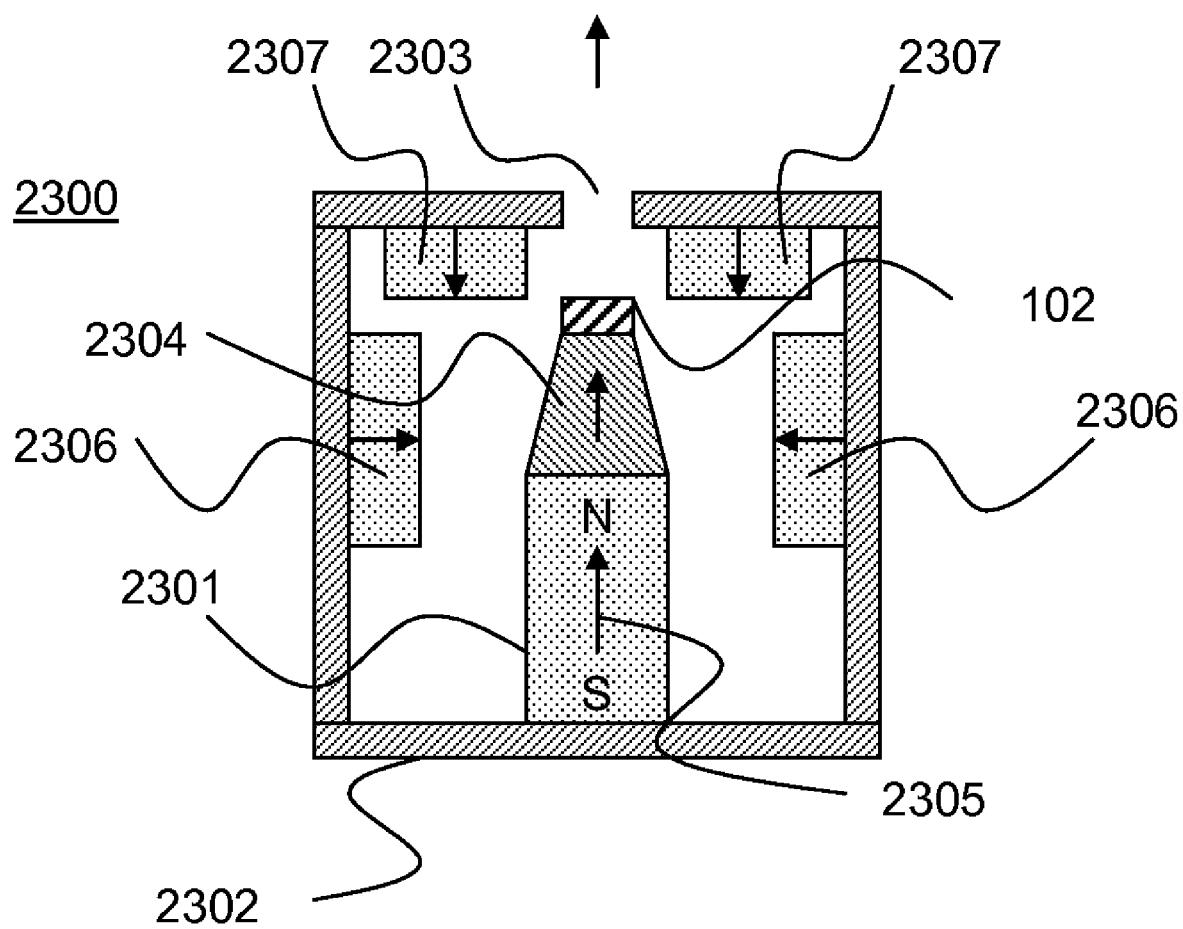
FIG. 23 shows a schematic of a permanent magnet projection lens.

FIG. 23 shows a schematic of a permanent magnet projection lens 2300. A permanent magnet cylinder 2301 is sited on the axis of a cylindrical soft magnetic yoke 2302. The soft magnetic yoke 2302 has a field aperture 2303. A pole piece 2304 sits at the end of the permanent magnet cylinder 2301 in front of the field aperture 2303. A sample 102 sits at the end of the pole piece 2304. The magnetic field direction is indicated by the direction of arrows 2305. A ring blocking permanent magnet 2306 and annular blocking permanent magnet 2307 are placed within the soft magnetic yoke 2302. The permanent magnet cylinder 2301 and other permanent magnets are preferably high strength rare earth magnets. The soft iron yoke 2302 is preferably a material such as mild steel AISI 1010. The pole piece 2304 is preferably a soft magnetic material with high saturation such as hydrogen annealed Permendur.

The magnetic field of the permanent magnet cylinder 2301 is concentrated by the soft high saturation pole piece 2304 which is a truncated cone. If the magnetic field lines remain within the soft high saturation pole piece 2304, the field lines at the top end of the truncated cone are closer together than at the base end so that the magnetic field is stronger. However, the presence of the soft magnetic yoke 2302 and the field aperture 2303 near the soft high saturation pole piece 2304 means that field lines can leak out of the side of the pole piece 2304. The ring blocking magnet 2306 and the annular blocking magnet 2307 are added to reduce this leakage. The addition of the ring blocking magnet 2306 and the annular blocking magnet 2307 produces a very strong field at the sample 102 and one which projects out beyond the field aperture 2303 in the soft magnetic yoke 2302. The direction of the magnetization in the annular blocking magnet 2307 opposing that of the pole piece 2304 is counterintuitive. It might be expected that a magnet near the end of the pole piece 2304 would be better able to produce a strong field if the magnetization were in the same direction.

Figure 24:
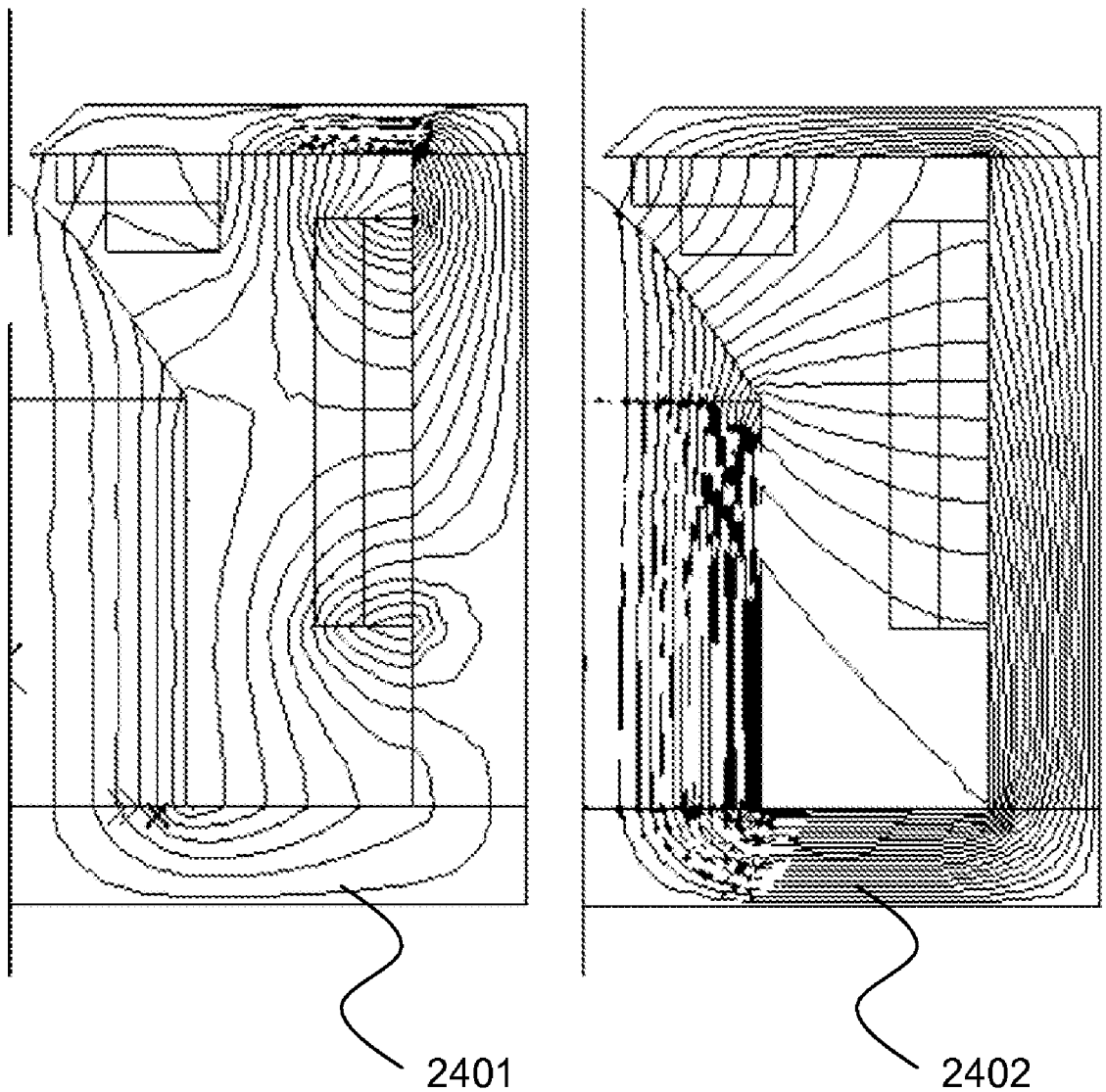
FIG. 24 shows plots of calculated flux of a permanent magnetic lens assembly with and without blocking magnets.

FIG. 24 shows the results of magnetic calculations for a similar geometric arrangement to the permanent magnet projection lens 2300. FIG. 24 shows field line plots over quarter sections of the permanent magnet projection lens 2300. The software used is MagNet from the Infolytica Corporation of Montreal. All permanent magnets are modeled as NdFeB grade 40, the pole piece 2304 as Permendur, the soft magnetic yolk 2303 as generic soft iron. The radius of the permanent magnet projection lens 2300 is modeled as 32 mm and the height as 50 mm. The field line plot on the left 2401 shows the field line distribution with blocking magnet field directions 2305 as shown in FIG. 23. In the field line plot on the right 2402 the blocking magnets 2306 and 2307 have been 'turned off' by making their material property 'air'. It can be seen that the field lines leak from the pole piece 2304 to the soft magnetic yolk 2303 before they reach the field aperture 2303. The calculated field at the surface of the pole piece 2304 in the plot on the left 2401 is 2.9 T while the field in the plot on the left 2402 is 1.9 T. This is a significant difference in that the brightness of the image for the same spatial resolution is the fourth power of the field, or just over a factor five.

Further analysis of the projection lens calculation shown in the plot on the left 2401 determined that a ×100 magnification can be achieved with a projection lens field length of 3-4 cms making the microscope compact and relatively inexpensive.

As will be appreciated by those ordinarily skilled in the art, modifications can be made to the shape and materials used in the magnetic projection lens shown in FIG. 24. Further, the directions of magnetization of the ring blocking permanent magnet 2306 and the annular blocking permanent magnet 2307 can be substantially opposed to the magnetization of the pole piece 2304 over a quarter circle from directly opposed to opposed around the axis of magnetization. The projection lens 200 is thus an apparatus comprising: a substantially cylindrical permanent magnet cylinder 2301 with the direction of magnetization substantially along its central axis; a magnetically soft pole piece 2304 approximately shaped as a truncated cone; a magnetically soft yoke 2302 with one end having a field aperture 2303; a ring blocking permanent magnet 2306; and an annular blocking permanent magnet 2307, the dimensions of these parts such that a gap is left between the pole piece 2304 and the field aperture 2303 where a sample 102 can be placed. The annular blocking permanent magnet 2307 is placed coaxially and in magnetic contact with the yoke 2302 such that its direction of magnetization opposes the direction of magnetization of the pole piece 2304, the dimensions of the annular blocking permanent magnet 2307 are such that the inner diameter shape clears the pole piece 2304 and the field aperture 2303. The greatest thickness of the annular blocking permanent magnet 2307 is most usefully less than the sum of the length of the pole piece 2303 and the gap as beyond that distance the ring blocking permanent magnet 2306 is producing the opposed field.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

I claim:

1. A charged particle optical device comprising:
    (a) a first means having a magnetic field;
    (b) a conducting plate with a plurality of substantially circular apertures;
    (c) said apertures having similar predetermined dimensions;
    (d) said apertures sit within said magnetic field with said apertures depths being approximately aligned to the direction of said magnetic field;
    (e) providing a second means to change a forward distance for one cyclotron orbit of charged particles so that said forward distance for one cyclotron orbit of said charged particles within a small multiple is similar to said aperture depths;
    whereby cyclotron orbit radii of said charged particles within said magnetic field are filtered by said dimensions of said apertures.

2. A charged particle optical device comprising:
    (a) a first means having a magnetic field;
    (b) a conducting plate with a plurality of substantially circular apertures;
    (c) said apertures having similar predetermined dimensions;
    (d) said apertures sit within said magnetic field with said apertures depths being approximately aligned to the direction of said magnetic field;
    (e) providing a second means to change a forward distance for one cyclotron orbit of charged particles so that said forward distance for one cyclotron orbit of said charged particles within a small multiple is similar to said aperture depths;
    (f) a third means to energy analyze said charged particles;
    whereby cyclotron orbit radii of said charged particles within said magnetic field are filtered by said dimensions of said apertures.

3. The third means to energy analyzer the said charged particles of claim 2 being a concentric hemispherical analyzer.

4. An electron microscope apparatus comprising:
    (a) a source of photons of sufficient energy to excite electrons from a material sample;
    (b) a magnetic projection lens;
    (c) a means to locate a sample within said magnetic projection lens;
    (d) providing a conducting plate with a plurality of substantially circular apertures;
    (e) said apertures having similar predetermined dimensions;
    (f) said apertures sit within said magnetic field with said apertures depths being approximately aligned to the direction of said magnetic field;
    (g) providing a second means to change a forward distance for one cyclotron orbit of charged particles so that said forward distance for one cyclotron orbit of said charged particles within a small multiple is similar to said aperture depths;
    (h) a third means to energy analyze said charged particles;
    (i) a fourth means to image the filtered said charged particles;
    whereby cyclotron orbit radii of said charged particles traveling within said magnetic field are filtered by said dimensions of said apertures and the imaging spatial resolution is increased.

5. The third means to energy analyzer the said charged particles of claim 4 being a concentric hemispherical analyzer.

* * * * *